(12) United States Patent
Takayama et al.

(10) Patent No.: US 7,542,500 B2
(45) Date of Patent: Jun. 2, 2009

(54) SEMICONDUCTOR LASER DEVICE

(75) Inventors: Toru Takayama, Nara (JP); Tomoya Satoh, Osaka (JP); Koichi Hayakawa, Okayama (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 83 days.

(21) Appl. No.: 11/889,920

(22) Filed: Aug. 17, 2007

(65) Prior Publication Data

US 2008/0175295 A1 Jul. 24, 2008

(30) Foreign Application Priority Data

Sep. 7, 2006 (JP) .............................. 2006-242513

(51) Int. Cl.
*H01S 5/00* (2006.01)

(52) U.S. Cl. .............................. 372/50.121; 372/43.01; 372/45.01

(58) Field of Classification Search ............ 372/50.121, 372/43.01, 45.01
See application file for complete search history.

(56) References Cited

U.S. PATENT DOCUMENTS

| | | | | |
|---|---|---|---|---|
| 6,052,397 A | * | 4/2000 | Jeon et al. | 372/46.01 |
| 6,075,801 A | * | 6/2000 | Tamanuki et al. | 372/46.01 |
| 6,600,847 B2 | * | 7/2003 | Saini et al. | 385/14 |
| 6,816,531 B1 | * | 11/2004 | Rossin et al. | 372/64 |
| 6,826,220 B2 | * | 11/2004 | Balsamo et al. | 372/50.1 |
| 6,898,227 B2 | * | 5/2005 | Crawford | 372/45.01 |
| 7,301,979 B2 | * | 11/2007 | Ito et al. | 372/46.01 |
| 2005/0048710 A1 | * | 3/2005 | Onishi | 438/202 |
| 2007/0237199 A1 | * | 10/2007 | Kashima et al. | 372/50.121 |

FOREIGN PATENT DOCUMENTS

| | | |
|---|---|---|
| JP | 64-061084 | 3/1989 |
| JP | 11-186651 | 7/1999 |

* cited by examiner

*Primary Examiner*—Minsun Harvey
*Assistant Examiner*—Phillip Nguyen
(74) *Attorney, Agent, or Firm*—McDermott Will & Emery LLP

(57) ABSTRACT

The semiconductor laser device includes first and second light emitting portions each including a first cladding layer, an active layer and a second cladding layer, and each having a stripe structure. The stripe structure of the first light emitting portion has a section having a width changing along a resonator direction and includes a first front end face, and relationships of $W_{f1} \geq W_1$; $W_1 > W_2$; and $(W_{f1}-W_1)/2L_1 < (W_1-W_2)/2L_2$ hold wherein $W_{f1}$ is a width on the first front end face; $W_1$ is a width in a position away from the first front end face by a distance $L_1$; and $W_2$ is a width in a position away from said the front end face by a distance $L_1+L_2$ (whereas $L_1+L_2 \leq L$). The stripe structure of the second first light emitting portion has a section having a width changing along a resonator direction and includes a second front end face, and relationships of $W_{f2} \geq W_3$; $W_3 > W_4$; and $(W_{f2}-W_3)/2L_3 < (W_3-W_4)/2L_4$ hold wherein $W_{f2}$ is a width on the second front end face; $W_1$ is a width in a position away from the second front end face by a distance $L_3$ (whereas $L_1 \neq L_3$); and $W_4$ is a width in a position away from the second front end face by a distance $L_3+L_4$.

14 Claims, 11 Drawing Sheets

DISTANCE FROM CENTER IN WIDTH DIRECTION

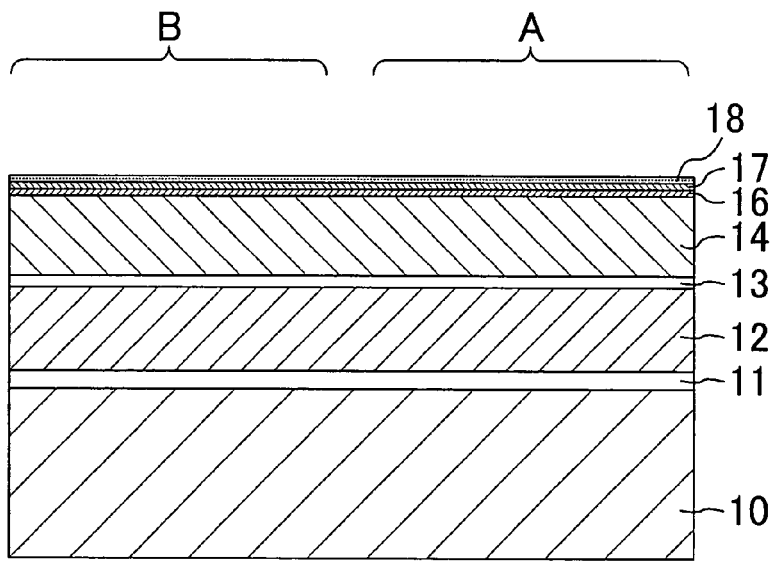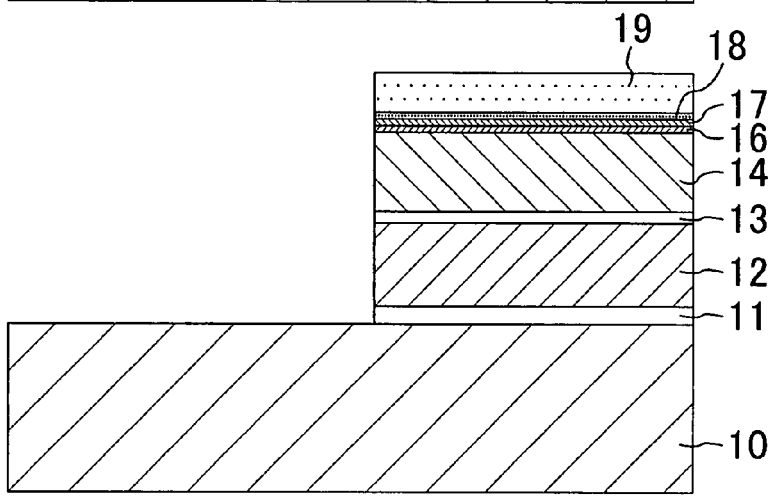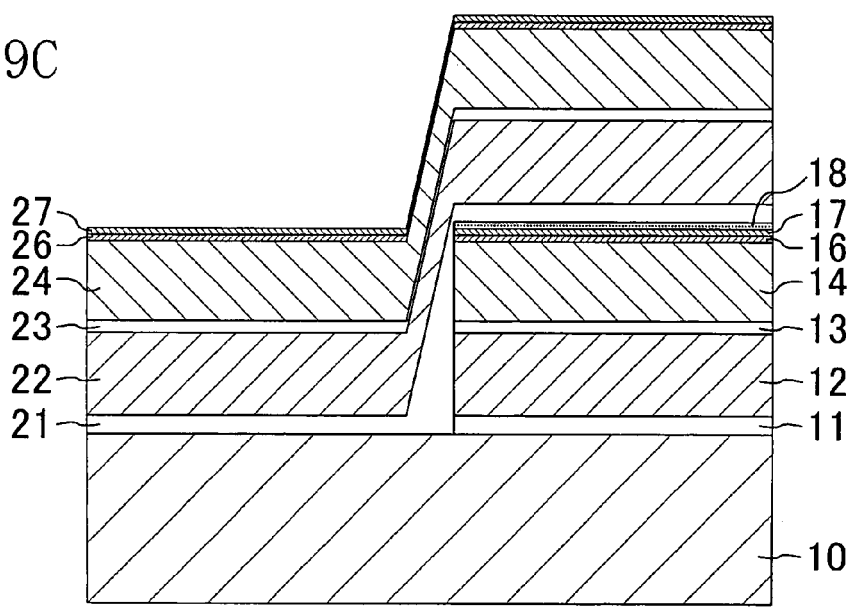

SEMICONDUCTOR LASER DEVICE

CROSS-REFERENCE TO RELATED APPLICATIONS

This application claims priority under 35 U.S.C. § 119 on Patent Application No. 2006-242513 filed in Japan on Sep. 7, 2006, the entire contents of which are hereby incorporated by reference.

BACKGROUND OF THE INVENTION

The present invention relates to a semiconductor laser device, and more particularly, it relates to a semiconductor laser device applicable to two wavelengths of a red region and an infrared region.

Currently, digital video discs (DVDs) capable of high density recording and having large capacity and DVD apparatuses for recording/reproducing data in/from DVDs are commercially available, and they are regarded as products expected to be in larger demand from now on. Since data is recorded in a high density in a DVD, an AlGaInP-based semiconductor laser of an emission wavelength of 650 nm is used as a laser light source for the recording/reproducing. Therefore, in an optical pickup of a conventional DVD apparatus, a CD-R cannot be reproduced by using an AlGaAs-based semiconductor laser of an emission wavelength of 780 nm.

Therefore, an optical pickup including lasers of two wavelengths by incorporating an AlGaInP-based semiconductor laser of an emission wavelength of a 650 nm band and an AlGaAs-based semiconductor laser of an emission wavelength of a 780 nm band into different packages as laser chips has been employed. Thus, an apparatus capable of reproducing data from any of a DVD, a CD and an MD has been realized.

The aforementioned optical pickup has, however, a large size because the two packages of the AlGaInP-based semiconductor laser and the AlGaAs-based semiconductor laser are both included. Therefore, a DVD apparatus using such an optical pickup unavoidably has a large size.

On the contrary, as described in Japanese Laid-Open Patent Publication No. 11-186651, an integration type semiconductor light emitting apparatus including a plurality of kinds of semiconductor light emitting devices of different emission wavelengths and having light emitting structures formed by growing semiconductor layers on one substrate is known.

An example of such a conventional integration type semiconductor light emitting apparatus is shown in FIG. 12. As shown in FIG. 12, in a conventional integration type semiconductor laser device 100, an AlGaAs-based semiconductor laser LD1 of an emission wavelength of a 700 nm band (of, for example, 780 nm) and an AlGaInP-based semiconductor laser LD2 of an emission wavelength of a 600 nm band (of, for example, 650 nm) are integrated on one n-type GaAs substrate 101 to be spaced from each other.

In this case, for example, a substrate having the (100) plane direction or having a plane inclined by 5 through 15 degrees from the (100) plane as the principal plane is used as the n-type GaAs substrate 101.

Also, in the AlGaAs-based semiconductor laser LD1, an n-type GaAs buffer layer 111, an n-type AlGaAs cladding layer 112, an active layer 113 with a single quantum well (SQW) structure or a multiple quantum well (MQW) structure, a p-type AlGaAs cladding layer 114 and a p-type GaAs capping layer 115 are successively stacked in this order on the n-type GaAs substrate 101.

An upper portion of the p-type AlGaAs cladding layer 114 and the p-type GaAs capping layer 115 are formed in a stripe shape extending along one direction. An n-type GaAs current confining layer 116 is provided on both sides of such a stripe-shaped portion, and thus, a current confining structure is formed. A p-side electrode 117 is provided on the stripe-shaped p-type GaAs capping layer 115 and the n-type GaAs current confining layer 116, and the p-side electrode 117 is in ohmic contact with the p-type GaAs capping layer 115. As the p-side electrode 117, for example, a Ti/Pt/Au electrode is used.

In the AlGaInP-based semiconductor laser LD2, an n-type GaAs buffer layer 121, an n-type AlGaInP cladding layer 122, an active layer 123 with the SQW structure or the MQW structure, a p-type AlGaInP cladding layer 124, a p-type GaInP intermediate layer 125 and a p-type GaAs capping layer 126 are successively stacked in this order on the n-type GaAs substrate 101.

An upper portion of the p-type AlGaInP cladding layer 124, the p-type GaInP intermediate layer 125 and the p-type GaAs capping layer 126 are formed in a stripe shape extending along one direction. An n-type GaAs current confining layer 127 is provided on both sides of such a stripe-shaped portion, and thus, a current confining structure is formed. A p-side electrode 128 is provided on the stripe-shaped p-type GaAs capping layer 126 and the n-type GaAs current confining layer 127, and the p-side electrode 128 is in ohmic contact with the p-type GaAs capping layer 126. As the p-side electrode 128, for example, a Ti/Pt/Au electrode is used.

Furthermore, on the back surface of the n-type GaAs substrate 101, an n-side electrode 129 is provided to be in ohmic contact with the n-type GaAs substrate 101. As the n-side electrode 129, for example, an AuGe/Ni electrode or an In electrode is used.

Moreover, the p-side electrode 117 of the AlGaAs-based semiconductor laser LD1 and the p-side electrode 128 of the AlGaInP-based semiconductor laser LD2 are respectively soldered onto heat sinks H1 and H2 provided on a package base 200 to be electrically separated from each other.

In the conventional integration type semiconductor laser device 100 having the aforementioned architecture, when a current is allowed to pass between the p-side electrode 117 and the n-side electrode 129, the AlGaAs-based semiconductor laser LD1 is driven. Also, when a current is allowed to pass between the p-side electrode 128 and the n-side electrode 129, the AlGaInP-based semiconductor laser LD2 is driven. In this case, a laser beam of the wavelength of the 700 nm band (of, for example, 780 nm) can be taken out by driving the AlGaAs-based semiconductor laser LD1, and a laser beam of the wavelength of the 600 nm band (of, for example, 650 nm) can be taken out by driving the AlGaInP-based semiconductor laser LD2. It is determined by switching an external switch whether the AlGaAs-based semiconductor laser LD1 or the AlGaInP-based semiconductor laser LD2 is to be driven.

In this manner, since the conventional integration type semiconductor laser device 100 includes the AlGaAs-based semiconductor laser LD1 of the emission wavelength of the 700 nm band the AlGaInP-based semiconductor laser LD2 of the emission wavelength of the 600 nm band, a laser beam for a DVD and a laser beam for a CD or an MD can be independently taken out. Therefore, when the integration type semiconductor laser device 100 is included as a laser light source in an optical pickup of a DVD apparatus, data can be recorded/reproduced in/from any of a DVD, a CD and an MD.

Since the AlGaAs-based semiconductor laser LD1 and the AlGaInP-based semiconductor laser LD2 have the laser structures made of the semiconductor layers grown on the same n-type GaAs substrate 101, the integration type semiconductor laser device can be contained in one package. Therefore, the optical pickup can be made compact, and hence, the DVD apparatus can be made compact.

Furthermore, a high optical output of a semiconductor laser is necessary for rapidly rewriting data in an optical disc. For example, in order to rewrite data in an optical disc of a DVD at a high speed exceeding a 4-time speed, a high output of 100 mW or more is necessary as the optical output. In order to obtain such a high output, it is necessary to prevent COD (catastrophic optical damage), that is, a phenomenon that the end face of the semiconductor laser is melt fractured by its own optical output in a high-output operation.

In order to prevent the COD, it is effective to suppress heat generation by reducing optical density within the end face of a resonator of the laser. As a known method employed for this purpose, the reflectance of a front end face of the semiconductor laser is lowered by coating the front end face, from which a laser beam is taken out, with a dielectric such as $SiO_2$, $Al_2O_3$ or amorphous Si.

In general, the reflectance on the resonator end face of a semiconductor laser device made of an AlGaInP-based material or an AlGaAs-based material is approximately 30% when the end face is not coated. In this case, approximately 30% of a laser beam is reflected on the resonator end face so as to be fed back to the inside of the resonator, and the remaining approximately 70% of the beam is taken out from the front end face.

On the contrary, when the front end face is coated with a dielectric film so as to attain reflectance of, for example, 10%, 10% of the laser beam is reflected on the resonator end face to be fed back to the inside of the resonator, and the remaining 90% of the beam is taken out from the front end face.

Specifically, in the case where a beam taken out from the front end face has the same optical output, the optical density on the resonator end face can be made ⅓ by lowering the reflectance on the front end face to ⅓. Accordingly, the lowering of the reflectance on the front end face leads to increase of a COD level, and hence is effective means for obtaining a high-output laser. Furthermore, when the reflectance on a rear end face disposed on the opposite side to the resonator end face from which a laser beam is taken out is set to be high, the efficiency for taking out light from the front end face of the semiconductor laser can be further increased.

In this manner, in a high-output semiconductor laser, end face coating conditions for lowering the reflectance on the front end face and obtaining high reflectance on the contrary on the rear end face, such as an end face coating condition for attaining low reflectance of, for example, 10% or less on the front end face and attaining high reflectance of 85% or more on the rear end face, are widely employed. When such an anti reflection (AR)/high reflection (HR) coating is provided, the external differential quantum efficiency (slope efficiency) of the current-optical output characteristic is improved, so that a high optical output can be realized with a small quantity of injected current. This coating prevents the occurrence of the COD by reducing the power density of the laser beam on the front end face during the operation.

Also in a dual-wavelength laser device in which semiconductor lasers respectively lasing in the red region and the infrared region are integrated on one substrate, the front end faces and the rear end faces of light emitting portions respectively for emitting red light and infrared are coated with dielectric films capable of simultaneously attaining low reflectance and high reflectance.

Another example of the background of the invention is disclosed in Japanese Laid-Open Patent Publication No. 64-61084.

SUMMARY OF THE INVENTION

It is expected that there are increasing demands in the future for a light source for an optical disc system capable of rapid writing for, for example, a DVD having not only a reproducing function but also a recording function and applicable to 16-time speed recording or a CD-R applicable to 48-time speed recording. In such an application, a laser used as a light source is required of an operation with high output of at least 200 mW or more.

As described above, in order to obtain a high-output laser, it is effective to lower the reflectance on a front end face and increase the reflectance on a rear end face for improving the COD level and improving the efficiency for taking out light.

When the reflectance on the front end face is lowered too much, however, a laser beam fed back to the inside of the resonator is reduced, which increases an oscillation threshold current value. Also, in the case where a semiconductor laser is used in an optical disc apparatus, when the reflectance on the front end face is lowered, noise derived from feedback light reflected on an optical disc (feedback induced noise) is easily caused.

Therefore, in a general high-output laser, in order to attain high efficiency for taking out light and to reduce the feedback induced noise, the end face coating is provided so that the reflectance on the front end face can be approximately 5 through 10%. Also, the rear end face is coated so as to attain reflectance as high as possible, and in general, it is coated so as to attain high reflectance of approximately 95% through 100%.

In this manner, in a high-output laser, there is a large difference between the reflectance on the front end face and the reflectance on the rear end face. In this case, distribution intensity along the resonator direction of light propagating through an active layer is not longitudinally symmetrical about the resonator but longitudinally asymmetrical with high optical field distribution intensity on a side of the front end face. In this case, on the side of the front end face where the optical field distribution intensity is high, stronger stimulated emission is caused than on the side of the rear end face, and hence, it is necessary to inject more electron-hole pairs than on the side of the rear end face.

In particular, during a high-output operation, electron-hole pairs fail in the active layer on the side of the front end face, which is one factor for causing saturation of luminous efficiency. When the saturation of luminous efficiency is thus caused, in the case where a high-output laser of 200 through 300 mW or more is to be obtained, the temperature characteristic is degraded so as to cause a serious problem.

In order to improve the temperature characteristic for improving the maximum optical output, it is effective to increase the area of an active layer region for emitting light. Therefore, Japanese Laid-Open Patent Publication No. 64-61084 describes a semiconductor laser having at least two end faces and including an active region composed of a region that is provided in at least one of one end face portion and an internal portion and has such a small width that light of basic lateral mode alone can pass, a region with a width successively increasing from the small width at an angle equal to or smaller than a light diffraction angle of the region having the small width, and a region that is provided in at least the other end face portion and has, over a given length, a constant width exceeding the maximum width of the region having the increasing width.

In this structure, a phenomenon that light is slightly spread due to the diffraction effect when it goes out from a narrow region to a wide region is utilized. In other words, since the width of the active region is increased at an angle substantially equal to the diffraction angle, the width of light can be gradually increased to the front end face and the rear end face by substantially directly increasing the lateral mode of the narrow region, and as a result, the optical density on the front end face can be lowered. Therefore, while reducing an operation carrier density, the maximum optical density on the front end face can be lowered, so that the temperature characteristic and the optical output can be improved.

However, there arise several problems when the stripe width is simply increased from the rear end face toward the front end face. One problem is that the maximum optical output at which the optical output is thermally saturated during a high temperature operation is lowered because an operation current value is increased due to the increase of the light emitting area. As another problem, even if the stripe width is gradually increased at an angle smaller than the diffraction angle, when the stripe width is increased, nonlinearity (kink) is caused in the current-optical output characteristic because of slight bilateral asymmetry of a waveguide included in the stripe, which makes an emission beam pattern asymmetric.

In particular, a red laser should be built on an inclined substrate such as a 10°-off substrate for obtaining an AlGaInP layer with a desired composition with occurrence of natural superlattice suppressed. Therefore, during etching performed in fabrication of the device, bilateral asymmetry is easily caused in a waveguide, and hence, the kink is easily caused.

Furthermore, there is a difference between an infrared laser for a CD-R and a red laser for a DVD in the band offset (ΔEc) of the conduction band of the active layer and the cladding layer. In the infrared laser with relatively large offset ΔEc, a smaller leakage current leaking from the active layer to the cladding layer is caused in a current injected into the active layer due to energy of heat generation.

Accordingly, a stripe shape for reducing the operation current value without causing the kink is different between the infrared laser for a CD-R and the red laser for a DVD and hence should be precisely examined.

Alternatively, with respect to a monolithic two-wavelength laser in which an infrared laser and a red laser are integrated on the same substrate, the lengths of their resonators are completely the same. In this case, the length of the resonators is generally determined in consideration of the temperature characteristic of the red laser with smaller band offset ΔEc than the infrared laser. When the resonator has a larger length, the temperature characteristic is better, but the operation current value is increased because the current-optical output efficiency is lowered as well as the cost for the chip is unavoidably increased because the chip area is increased. Therefore, the resonator preferably has a length as small as possible.

Accordingly, the operation current value of the infrared laser is disadvantageously increased unless a structure having a resonator length as small as possible and simultaneously attaining a high kink level, a low operation current value and a high thermal saturation optical output level is found as a stripe shape for maximizing the current use efficiency of the red laser.

The increase of the operation current value causes heat generation of the optical pickup and increases driving current capacity of an LSI used for driving the laser. Therefore, in application to an optical disc system with a poor heat releasing property such as a notebook PC, the increase of the operation current value causes a serious problem also from the viewpoint of a battery life time. Accordingly, it is necessary to simultaneously find a stripe shape for minimizing the operation current value also with respect to the infrared laser.

The semiconductor laser device of this invention includes a first light emitting portion and a second light emitting portion provided on a substrate and having the same resonator length $L$, each of the first light emitting portion and the second light emitting portion includes a first cladding layer of a first conductivity type, an active layer provided on the first cladding layer and a second cladding layer of a second conductivity type provided on the active layer, and has a stripe structure for injecting carriers, the stripe structure of the first light emitting portion has a section having a width changing along a resonator direction and includes a first front end face, the following relationships hold:

$$W_{f1} \geq W_1;\ W_1 > W_2;\ \text{and}\ (W_{f1}-W_1)/2L_1 < (W_1-W_2)/2L_2$$

wherein $W_{f1}$ is a width of the stripe structure on the first front end face; $W_1$ is a width of the stripe structure in a position away from the first front end face by a distance $L_1$; and $W_2$ is a width of the stripe structure in a position away from the first front end face by a distance $L_1+L_2$ (whereas $L_1+L_2 \leq L$), and the stripe structure of the second light emitting portion has a section having a width changing along a resonator direction and includes a second front end face, and the following relationships hold:

$$W_{f2} \geq W_3;\ W_3 > W_4;\ \text{and}\ (W_{f2}-W_3)/2L_3 < (W_3-W_4)/2L_4,$$

wherein $W_{f2}$ is a width of the stripe structure on the second front end face; $W_1$ is a width of the stripe structure in a position away from the second front end face by a distance $L_3$ (whereas $L_1 \neq L_3$); and $W_4$ is a width of the stripe structure in a position away from the second front end face by a distance $L_3+L_4$ (whereas $L_3+L_4 \leq L$).

In other words, in the stripe structure of the first light emitting portion, a value of $(W_{f1}-W_1)/2L_1$ corresponding to a reduction rate of the stripe width in a range from the first front end face to the position away from the first front end face by the distance $L_1$ is preferably smaller than a value of $(W_1-W_2)/2L_2$ corresponding to a reduction rate of the stripe width in a range, closer to a rear end face, from the position away from the first front end face by the distance $L_1$ to the position away from the first front end face by the distance $L_1+L_2$.

Similarly, in the stripe structure of the second light emitting portion, a value of $(W_{f2}-W_3)/2L_3$ corresponding to a reduction rate of the stripe width in a range from the second front end face to the position away from the second front end face by the distance $L_3$ is preferably smaller than a value of $(W_3-W_4)/2L_4$ corresponding to a reduction rate of the stripe width in a range, closer to a rear end face, from the position away from the second front end face by the distance $L_3$ to the position away from the second front end face by the distance $L_3+L_4$.

Thus, the series resistance is lowered to reduce the operation current and the luminous efficiency can be improved in each of the first and second light emitting portions. This is for the following reason:

First, in a structure where the light reflectance on a front end face of a resonator is set to be lower than the light reflectance on a rear end face, the optical density within the resonator is higher in a part closer to the front end face. Therefore, the quantity of injected current is preferably increased by increasing the stripe width on a side of the front end face. In this manner, the slope efficiency of the current-optical output characteristic is improved so as to attain a good temperature characteristic. However, when the stripe width is changed, the scattering loss of guided light on the sidewall is increased, and therefore, the width change is preferably smaller in a region closer to the front end face where the optical density is high.

Furthermore, since stimulated emission is strong in the vicinity of the center along the width direction of the stripe structure, the carrier density is lowered, which causes a phenomenon that a distribution has a recess. This phenomenon is conspicuously caused when the stripe width is larger and is a factor for causing kink.

Moreover, when the stripe width is increased, the series resistance of the device is lowered, and hence, the operation voltage can be reduced.

Accordingly, the stripe structure preferably has a section in which the stripe width is changed to be smaller in a direction from the front end face toward the rear end face, and the change rate of the width is preferably larger on a side close to the rear end face than on a side close to the front end face.

An oscillation wavelength of the first light emitting portion is preferably longer than an oscillation wavelength of the second light emitting portion, and preferably there is a relationship of $L_1 > L_3$.

Thus, in the case where the first light emitting portion and the second light emitting portion have different oscillation wavelengths, the luminous efficiency can be improved and occurrence of the kink in the current-optical output characteristic can be suppressed in each of the first and second light emitting portions.

Furthermore, preferably there is a relationship of Rf<Rf between reflectance Rf on each of the first front end face and the second front end face and reflectance Rr on a rear end face of the stripe structure of each of the first and second light emitting portions.

Thus, the luminous efficiency can be improved and a high COD level can be realized in each of the first and second light emitting portions.

Each of the first cladding layer and the second cladding layer is preferably made of an AlGaInP-based material.

Thus, ridge portions used for forming the stripe structures can be simultaneously formed in the first and second light emitting portions, and hence, the fabrication process can be simplified and the fabrication cost can be reduced.

Moreover, the active layer of the first light emitting portion is preferably made of a GaAs-based, AlGaAs-based or InGaAsP-based material, and the active layer of the second light emitting portion is preferably made of an InGaP-based or AlGaInP-based material.

Thus, a semiconductor laser device including the first light emitting portion for emitting light of the infrared region and the second light emitting portion for emitting light of the red region can be obtained.

Furthermore, the active layer of at least one of the first light emitting portion and the second light emitting portion is preferably a quantum well active layer.

Thus, a semiconductor laser device with a small oscillation threshold current value and high luminous efficiency can be obtained.

Moreover, a part of the active layer is preferably disordered by introducing an impurity into at least one end face of the stripe structure of each of the first light emitting portion and the second light emitting portion.

Thus, the region having large band gap energy owing to the disordering is transparent against a laser oscillation light, and hence, a semiconductor laser device with a high COD level can be obtained.

Furthermore, the stripe structure of each of the first light emitting portion and the second light emitting portion preferably includes a mesa-shaped ridge portion, and layers made of the same material are preferably formed on sidewalls of the mesa-shaped ridge portions in the first light emitting portion and the second light emitting portion.

Owing to this structure, the layers made of the same material used as, for example, current blocking layers can be simultaneously formed in the first light emitting portion and the second light emitting portion, and hence, the fabrication process can be simplified and the fabrication cost can be reduced.

Also, the same material is preferably an AlInP-based material or an AlGaInP-based material. The current blocking layers thus formed are transparent against the laser oscillation light. Therefore, an effective refractive index waveguide type semiconductor laser device including at least two light emitting portions and having reduced waveguide loss, a small oscillation threshold current value, high luminous efficiency and a small astigmatic difference can be obtained.

Furthermore, the same material is preferably a dielectric material. Thus, an effective refractive index waveguide mechanism can be realized, so that the operation current value and the oscillation threshold current value of the semiconductor laser device can be reduced.

Moreover, the dielectric material preferably includes at least one of amorphous Si, SiN, $SiO_2$, $TiO_2$ and $Al_2O_3$. Alternatively, it may include a multilayered structure including any of these materials. Any of these materials can be specifically used as the dielectric material, and these materials are preferred because the layers made of the same material are transparent against the laser oscillation light.

Furthermore, assuming that a distance from a point with the minimum width of the stripe structure in the first light emitting portion to the first front end face is $L_5$, that a distance from a point with the minimum width of the stripe structure in the second light emitting portion to the second front end face is $L_6$, and that the first front end face and the second front end face have reflectance Rf and a rear end face of the stripe structure has reflectance Rr, there is a relationship of Rf<Rr, and each of the distances $L_5$ and $L_6$ is different from a distance represented as L×ln(Rf)/ln(Rf×Rr) by 200 μm or less (whereas ln is natural logarithm).

In general, assuming that the front end face and the rear end face respectively have reflectance Rf and Rr and the resonator has a length L, a point having the minimum optical density along the resonator direction is a point away from the front end face by a distance of L×ln(Rf)/ln(Rf×Rr). Therefore, the width of the ridge portion is changed along the resonator direction in accordance with this optical distribution intensity, so that the ridge width can be reduced in accordance with the reduction of the optical density. Thus, a laser in which gain saturation is minimally caused even in a high-output operation and which has a good temperature characteristic and high efficiency can be obtained. In particular, when a difference between a distance from the front end face to the point with the minimum ridge width and a distance from the front end face of L×ln(Rf)/ln(Rf×Rr) is 200 μm or less, the use current efficiency can be further increased.

Moreover, an oscillation wavelength of the first light emitting portion is preferably longer than an oscillation wavelength of the second light emitting portion, and preferably there is a relationship of $W_{f1} > W_{f2}$.

Thus, a semiconductor laser device in which a kink level (i.e., a current value at which the kink is caused in the current-optical output characteristic) is high and an operation current and an operation voltage are low can be obtained.

Also, the active layer preferably has a window region that is disordered by introducing an impurity, and no current is injected into the window region.

Thus, non-radiative recombination making no contribution to the laser oscillation can be reduced in the window region, and hence, heat generation of the device in the window region can be suppressed. As a result, a COD level can be prevented from lowering.

As described so far, according to the present invention, in a semiconductor laser device including a plurality of light emitting portions for light of, for example, a red region and an infrared region integrated on one substrate, the width of a ridge stripe is constant or gradually reduced toward a rear end face along the length of a resonator in a front end face region where the optical density is high and then is abruptly reduced. Furthermore, the length of the front end face region where the stripe width is constant or gradually reduced is set to be longer in the infrared light emitting portion than in the red light emitting portion. Thus, the semiconductor laser device can attain a high kink level, a low operation current and a low operation voltage in both the red light emitting portion and the infrared light emitting portion. Accordingly, this device is useful as, for example, a laser device for an optical pickup including a red laser and an infrared laser.

BRIEF DESCRIPTION OF THE DRAWINGS

FIGS. 9A, 9B and 9C are diagrams for showing procedures in fabrication of the semiconductor laser device 1.

DETAILED DESCRIPTION OF THE INVENTION

A semiconductor laser device according to an embodiment of the invention will now be described with reference to the accompanying drawings.

Figure 1A:
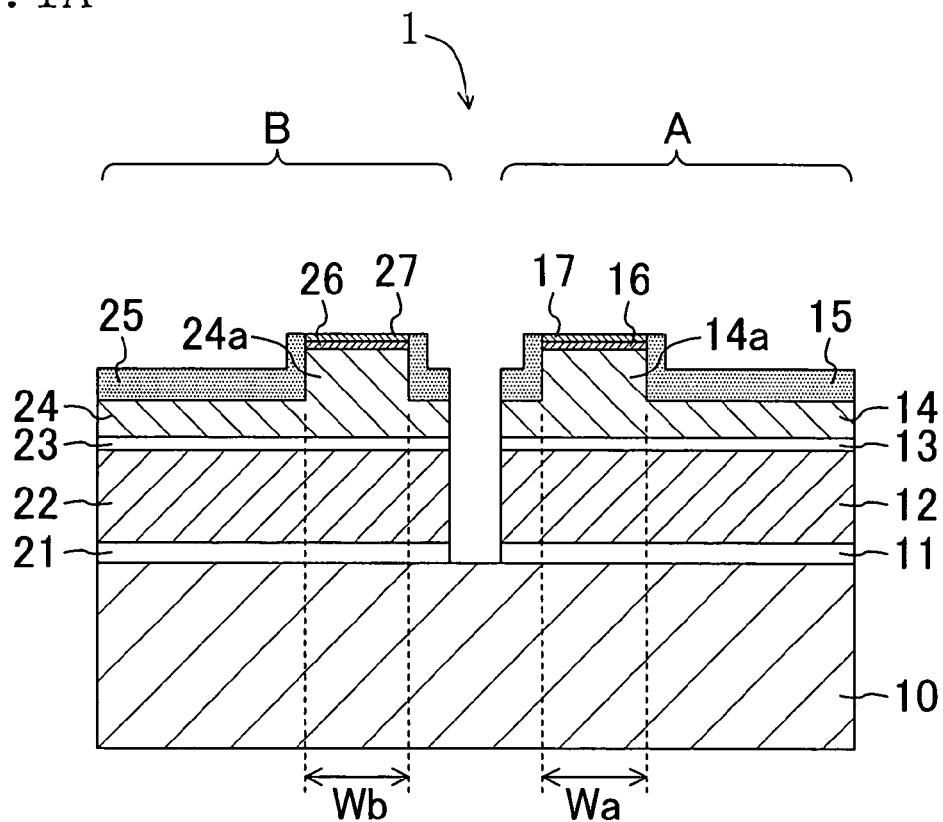
FIG. 1A is a schematic cross-sectional view of a semiconductor laser device 1 according to an embodiment of the invention and FIGS. 1B and 1C are diagrams for respectively showing multilayered structures of active layers 13 and 23.

FIG. 1A is a schematic cross-sectional view of a semiconductor laser device 1 of this embodiment.

In the semiconductor laser device 1, a red laser A and an infrared laser B are integrated, as two light emitting portions for emitting light of different wavelengths, on an n-type GaAs substrate 10 having, as the principal plane, a plane inclined from the (100) plane by 10 degrees along the [011] direction. First, the structure of the red laser A will be described.

The red laser A has a structure in which an n-type buffer layer 11 (with a thickness of 0.5 μm) made of n-type GaAs, an n-type cladding layer 12 (with a thickness of 2.0μ) made of n-type $(Al_{0.7}Ga_{0.3})_{0.51}In_{0.49}P$, an active layer 13 having a strained quantum well structure, a p-type cladding layer 14 made of p-type $(Al_{0.7}Ga_{0.3})_{0.51}In_{0.49}P$, a p-type intermediate layer 16 (with a thickness of 50 nm) made of p-type $Ga_{0.51}In_{0.49}P$ and a p-type contact layer 17 (with a thickness of 0.4 μm) made of p-type GaAs are stacked in this order in the upward direction on the n-type GaAs substrate 10.

At this point, a mesa-shaped ridge portion 14a is provided in the p-type cladding layer 14, and the p-type intermediate layer 16 and the p-type contact layer 17 are formed on the ridge portion 14a. Furthermore, a current blocking layer 15 (with a thickness of 0.7 μm) made of n-type AlInP is formed so as to cover the sidewall of the ridge portion 14a and a part of the p-type cladding layer 14 excluding the ridge portion 14a. It is noted that the ridge portion 14a has a width Wa.

In this case, a distance from the upper end of the ridge portion 14a to the bottom of the p-type cladding layer 14 in contact with the active layer 13 is 1.4 μm, and a distance from the lower end of the ridge portion 14a to the bottom of the p-type cladding layer 14 in contact with the active layer 13 is indicated by dp (that is, 0.2 μm).

Figure 1B:
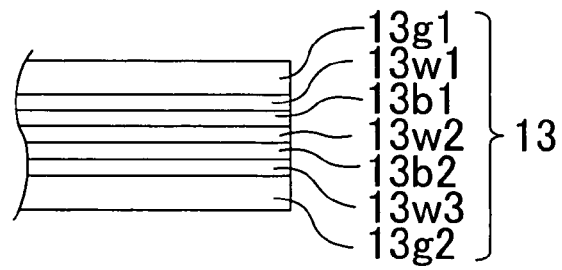

Also, the active layer 13 is a strained quantum well active layer and has a structure shown in FIG. 1B. Specifically, it has a structure including three well layers 13w1, 13w2 and 13w3 made of $Ga_{0.48}In_{0.52}P$, two barrier layers 13b1 and 13b2 (each having a thickness of 5 nm) made of $(Al_{0.5}Ga_{0.5})_{0.51}In_{0.49}P$ respectively sandwiched among the well layers, and a first guide layer 13g1 made of $(Al_{0.5}Ga_{0.5})_{0.51}In_{0.49}P$ and a second guide layer 13g2 (with a thickness of 50 nm) made of $(Al_{0.5}Ga_{0.5})_{0.51}In_{0.49}P$ vertically sandwiching the other five layers.

In this structure, a current injected through the p-type contact layer 17 is confined by the current blocking layer 15 in the mesa-shaped ridge portion 14a alone and hence is collectively injected into a stripe part of the active layer 13 disposed beneath the ridge portion 14a. As a result, an inverted distribution state of carriers necessary for laser oscillation can be realized with a small injected current of approximately several tens mA.

Light emitted through recombination of carriers injected into the active layer 13 in this manner is confined along a direction vertical to the active layer 13 by the n-type cladding layer 12 and the p-type cladding layer 14. Also, along a direction parallel to the active layer 13, the light is confined because the current blocking layer 15 has a smaller refractive index than the n-type cladding layer 12 and the p-type cladding layer 14.

Furthermore, the current blocking layer 15 is transparent against laser oscillation light and hence does not absorb the light, so as to realize a waveguide with small loss. Moreover, since the distribution of light propagating through the waveguide can largely exude into the current blocking layer 15, a refractive index difference Δn of $10^{-3}$ order, which is suitable for a high-output operation, can be easily obtained. Furthermore, the refractive index difference Δn can be precisely controlled with the $10^{-3}$ order by controlling the distance dp.

Accordingly, the red laser A is a high-output semiconductor laser that can be precisely controlled in the optical field distribution and operated with a small operation current.

Next, the infrared laser B has a structure similar to that of the red laser A excluding the structure of the active layer and is operated in a similar manner excluding the wavelength of emitted light. This will now be described in detail.

The infrared laser B has a structure in which an n-type buffer layer 21 (with a thickness of 0.5 μm) made of n-type GaAs, an n-type cladding layer 22 (with a thickness of 2.0μ) made of n-type $(Al_{0.7}Ga_{0.3})_{0.51}In_{0.49}P$, an active layer 23 having a quantum well structure, a p-type cladding layer 24 made of p-type $(Al_{0.7}Ga_{0.3})_{0.51}In_{0.49}P$, a p-type intermediate layer 26 (with a thickness of 50 nm) made of p-type $Ga_{0.51}In_{0.49}P$ and a p-type contact layer 27 (with a thickness of 0.4 μm) made of p-type GaAs are stacked in this order in the upward direction on the n-type GaAs substrate 10 that is commonly used in the red laser A.

At this point, a mesa-shaped ridge portion 24a is provided also in the p-type cladding layer 24, and the p-type intermediate layer 26 and the p-type contact layer 27 are formed on the ridge portion 24a. Furthermore, a current blocking layer 25 (with a thickness of 0.7 μm) made of n-type AlInP is formed so as to cover the sidewall of the ridge portion 24a and a part of the p-type cladding layer 24 excluding the ridge portion 24a. It is noted that the ridge portion 24a has a width Wb.

In this case, a distance from the upper end of the ridge portion 24a to the bottom of the p-type cladding layer 24 in contact with the active layer 23 is 1.4 μm, and a distance from the lower end of the ridge portion 24a to the bottom of the p-type cladding layer 24 in contact with the active layer 23 is indicated by dp (that is, 0.24 μm).

Figure 1C:
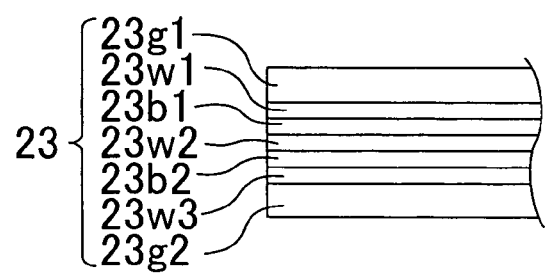

Also, the active layer 23 is a quantum well active layer and has a structure shown in FIG. 1C. Specifically, it has a structure including three well layers 23w1, 23w2 and 23w3 made of GaAs, two barrier layers 23b1 and 23b2 made of $Al_{0.5}Ga_{0.5}As$ respectively sandwiched among the well layers, and a first guide layer 23g1 made of $Al_{0.5}Ga_{0.5}As$ and a second guide layer 23g2 made of $Al_{0.5}Ga_{0.5}As$ vertically sandwiching the other five layers.

In this structure, a current injected through the p-type contact layer 27 is confined by the n-type current blocking layer 25 in the mesa-shaped ridge portion 24a alone in the same manner as in the red laser A and hence is collectively injected into a stripe part of the active layer 23 disposed beneath the ridge portion 24a. As a result, an inverted distribution state of carriers necessary for laser oscillation can be realized with a small injected current of approximately several tens mA.

Light emitted through recombination of carriers injected into the active layer 23 is confined in the same manner as in the red laser A. Specifically, along a direction vertical to the active layer 23, the light is confined by the n-type cladding layer 22 and the p-type cladding layer 24. Also, along a direction parallel to the active layer 23, the light is confined because the current blocking layer 25 has a smaller refractive index than the n-type cladding layer 22 and the p-type cladding layer 24.

Furthermore, the current blocking layer 25 is also transparent against laser oscillation light and hence does not absorb the light, so as to realize a waveguide with small loss. Moreover, since the distribution of light propagating through the waveguide can largely exude into the current blocking layer 15 in the same manner as in the red laser A, a refractive index difference Δn of $10^{-3}$ order, which is suitable for a high-output operation, can be easily obtained. Furthermore, the refractive index difference Δn can be precisely controlled with the $10^{-3}$ order by controlling the distance dp.

Accordingly, the infrared laser B is a high-output semiconductor laser that can be precisely controlled in the optical field distribution and operated with a small operation current.

Moreover, in an operation at a high temperature of, for example, 80° C. of a high-output laser of 350 mW or more, in order to improve the heat releasing property, the operation current density is lowered by setting the length of the resonator to 1500 μm or more. Specifically, the length of the resonator is 1750 μm in this embodiment.

Furthermore, in each of the red laser A and the infrared laser B, coating with a dielectric film is provided so that the reflectance against a red laser beam or an infrared laser beam can be 7% on the front end face of the resonator and 94% on the rear end face.

Figure 2:
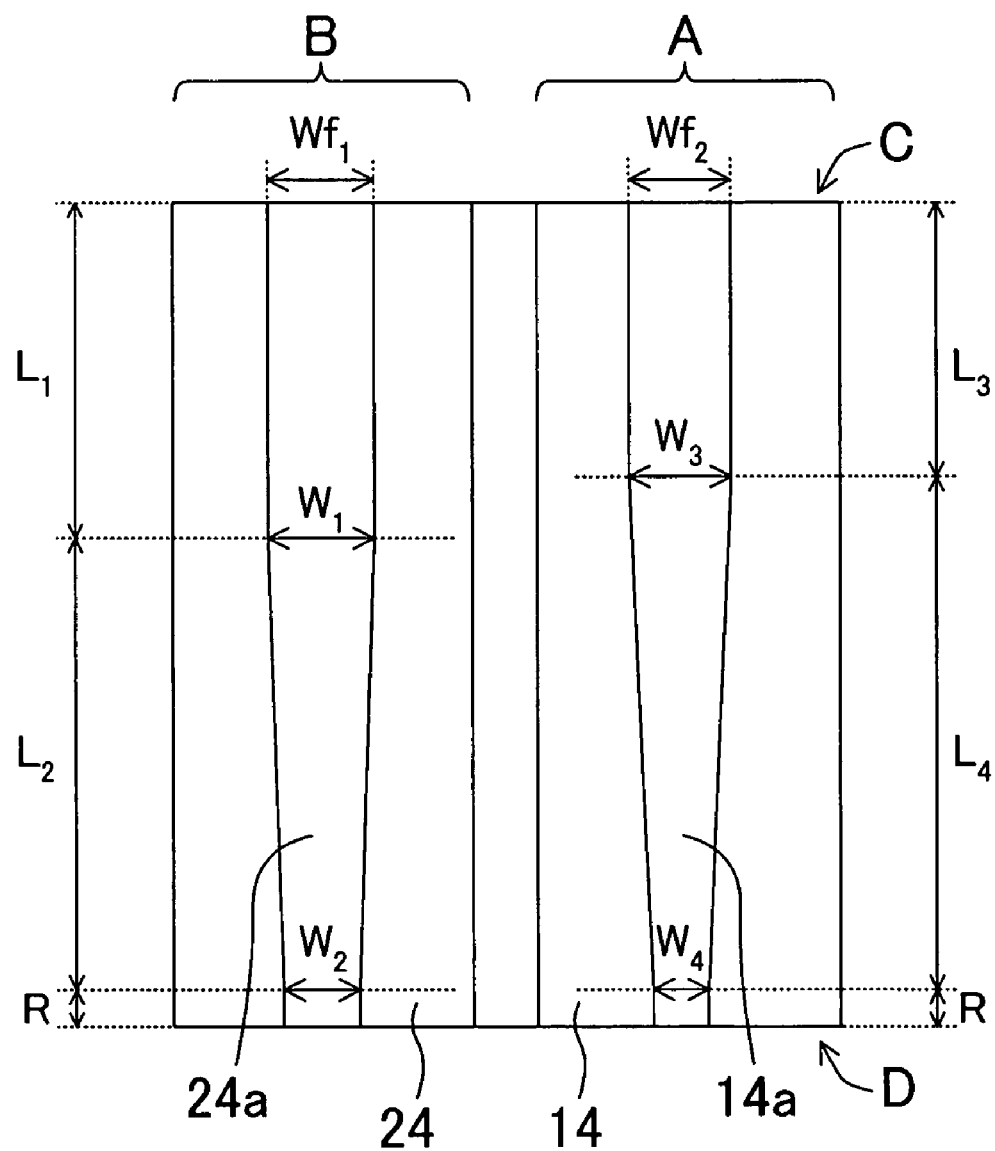
FIG. 2 is a schematic diagram for showing a ridge shape of the semiconductor laser device 1 of the embodiment of the invention.

Next, the plane structure of the semiconductor laser device 1 will be described with reference to FIG. 2. FIG. 2 shows the shapes of the mesa-shaped ridge portion 14a of the red laser A and the mesa-shaped ridge portion 24a of the infrared laser B and the shapes of the p-type cladding layers 14 and 24 in the semiconductor laser device 1 seen from a side of the ridge portion 14a. In this drawing, a side indicated by C corresponds to the front end face from which light is emitted and an opposite side indicated by D corresponds to the rear end face.

As shown in FIG. 2, each of the ridge portions 14a and 24a is formed in the shape of a stripe having a width gradually reducing from the side of the front end face C toward the side of the rear end face D. It is noted that a ridge width herein means the width at the lower end of the ridge portion 14a or 24a as shown in FIG. 1A as the width Wa or Wb.

More specifically, with respect to the ridge portion 24a of the infrared laser B, the ridge width on the front end face C is, for example, 3.8 μm. Also, the width of the ridge portion 24a is constant (at 3.8 μm) over a range of a distance L1 from the front end face C toward the rear end face D. Furthermore, the ridge width is gradually reduced from a position corresponding to the distance $L_1$ toward the rear end face D and becomes 2.1 μm in a position away from the front end face C by a distance $L_1+L_2$. Thereafter, the ridge width is constant again over a range from the position corresponding to the distance $L_1+L_2$ to the rear end face D (that is, a rear straight section R).

Similarly, with respect to the ridge portion 14a of the red laser A, the ridge width on the front end face C is, for example, 3.5 μm. Also, the width of the ridge portion 14a is constant (at 3.5 μm) over a range of a distance $L_3$ from the front end face C toward the rear end face D. Furthermore, the ridge width is gradually reduced from a position corresponding to the distance $L_3$ toward the rear end face D and becomes 2.1 μm in a position away from the front end face C by a distance $L_3+L_4$. Thereafter, the ridge width is constant again over a range from the position corresponding to the distance $L_3+L_4$ to the rear end face D (that is, a rear straight section R).

It is noted that the distance $L_1$ is set to be larger than the distance $L_3$. The widths and the shapes of the ridge portions including the reason for this relationship between the distances $L_1$ and $L_3$ will now be described with reference to FIG. 3.

Figure 3:
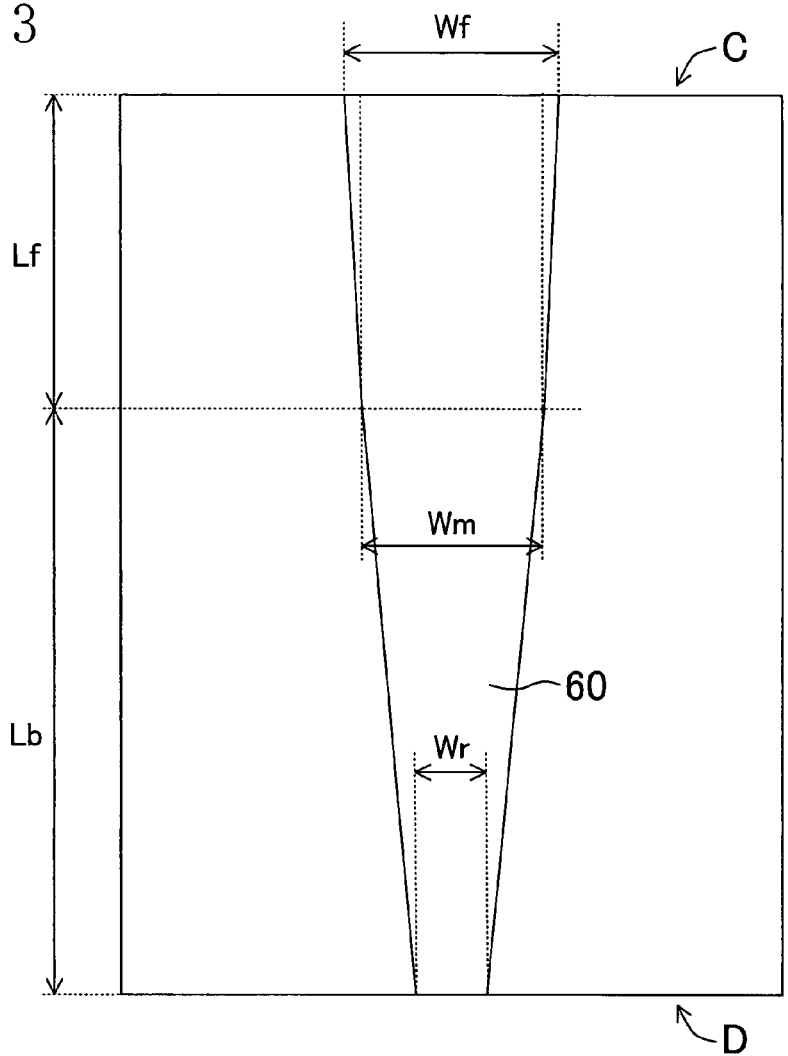
FIG. 3 is a diagram for explaining the ridge shape employed in the embodiment of the invention.

FIG. 3 shows the shape of a ridge portion 60 similar to the ridge portions 14a and 24a. In this drawing, the ridge portion

60 is also in a shape having a width gradually reducing from the side of the front end face C toward the side of the rear end face D.

More specifically, the ridge portion 60 has a width Wf on the front end face C. Also, the width is gradually reduced toward the rear end face D, and becomes a width Wm in a position away from the front end face C by a distance Lf. From this position, the width is further reduced toward the rear end face D at a larger change rate and becomes a width Wr on the rear end face D. A distance between the position away from the front end face C by the distance Lf and the rear end face D is indicated by Lb.

In general, the coating with a dielectric film is provided in a high-output laser, so that the reflectance Rf on the front end face C can be as low as 10% or less and the reflectance Rr on the rear end face D can be as high as 75% or more. Thus, the efficiency for taking out light on the front end face C can be improved and the optical density in the vicinity of the front end face D can be reduced, and therefore, an optical output level at which the end faces of the laser suffer from the catastrophic optical damage (COD) can be improved.

In this case, the optical density in the waveguide along the resonator direction is higher on a side closer to the front end face C than on a side closer to the rear end face D. Therefore, the quantity of carriers of the active layer necessary to be consumed in the laser oscillation is larger in a region close to the front end face C. Accordingly, when a larger current is injected into the side of the front end face C where the optical density is relatively higher in the resonator, the slope efficiency of the current-optical output characteristic can be improved, resulting in obtaining a device with a good temperature characteristic. Such a method for injecting the current can be realized by employing a ridge portion in a shape having a width gradually reducing from the front end face C toward the rear end face D like the ridge portion 60 shown in FIG. 3.

In the case where the ridge width is changed, the scattering loss of guided light on the sidewall of the ridge portion is increased so as to lower the efficiency. This is a phenomenon conspicuously occurs when the optical density is high, and hence, in order to suppress the increase of the loss in the waveguide derived from the change of the ridge width, the change rate of the ridge width is preferably smaller in a position closer to the front end face C where the optical density is higher. Therefore, the change rate for reducing the ridge width is smaller in a range over the distance Lf from the front end face C than in a range from the position corresponding to the distance Lf to the rear end face D. Furthermore, the ridge width may be constant in a region close to the front end face C, which applies to the ridge portions 14a and 24a shown in FIG. 2.

Next, a difference between the red laser A and the infrared laser B will be examined. Differences in the band gap energy of the active layer and the band gap energy of the cladding layer are larger in the infrared laser B than in the red laser A. Therefore, overflow of thermally excited carriers is smaller in the infrared laser B than in the red laser A.

Moreover, the AlGaAs-based material used for the active layer 23 of the infrared laser B can attain larger gain than the GaAlInP-based material used for the active layer 13 of the red laser A in the same carrier density.

Therefore, in a high-output operation performed at a high temperature, the operation carrier density is lower in the infrared laser B than in the red laser A.

Next, a distribution of the operation carrier density along a horizontal direction in the active layer will be examined. The optical field distribution intensity along the width direction of the ridge portion is the highest at the center, and strong stimulated emission is caused at the center. Therefore, the carrier concentration is relatively low in the vicinity of the center of the stripe portion as shown in a carrier concentration distribution with a recess in FIG. 4. This phenomenon is designated as spatial hole burning of the carriers.

Figure 4:
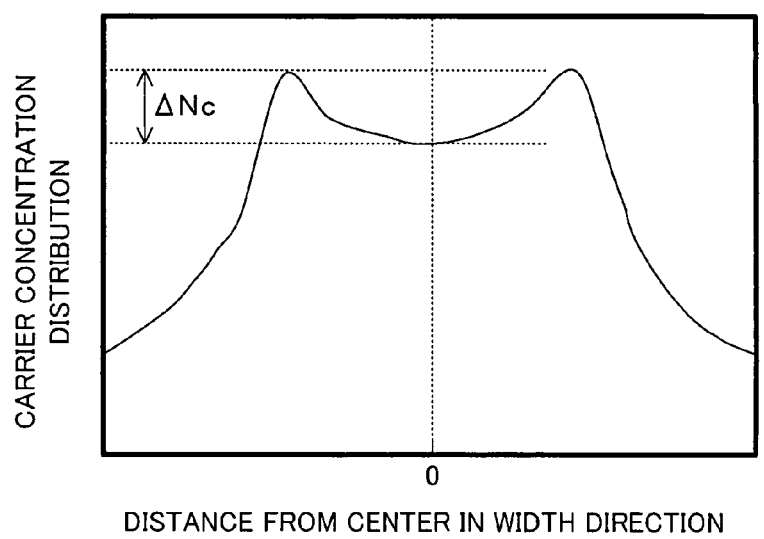
FIG. 4 is a diagram for showing spatial hole burning of operation carriers in an active layer.

The size of the recess in the carrier concentration is herein indicated by $\Delta Nc$ as shown in FIG. 4. As the size $\Delta Nc$ is larger, a gain distribution along the horizontal direction in the active layer is lower in the vicinity of the center of the ridge portion and higher beneath the end of the ridge portion. When such a distribution is obtained, the optical field distribution is laterally shifted owing to slight bilateral (lateral) asymmetry of the ridge portion, resulting in causing kink. In order to suppress such a phenomenon, the operation carrier density is preferably low. Accordingly, when the ridge widths are the same, the operation carrier density is lower in the infrared laser B with a better temperature characteristic than in the red laser A, and hence the kink is less likely caused in the infrared laser B.

Moreover, as the width of the ridge portion is larger, the optical field distribution is more easily confined within the ridge portion and the size $\Delta Nc$ is larger. Therefore, when the ridge width is increased, the kink level is lowered due to the spatial hole burning of the carriers.

On the other hand, the ridge width affects series resistance of the device. In other words, when the ridge width is large, a current injecting region is large, and hence, the series resistance of the device is lowered and the operation voltage is lowered. This leads to reduction of power consumption and further lowers the heat generation, which makes a contribution to improving the temperature characteristic of the device. Furthermore, a voltage for driving the laser can be lowered, which is advantageous in the circuit design.

Accordingly, the ridge width is preferably set to be as large as possible without lowering the kink level.

The description of the ridge shape given so far is summarized as follows: (1) In consideration of the current-optical output characteristic, the ridge width is preferably gradually reduced from the side of the front end face toward the side of the rear end face in order to improve the slope efficiency; (2) the ridge width is preferably larger in order to reduce the operation voltage; and (3) the ridge width is preferably smaller in order to suppress the occurrence of the kink. Moreover, in a region close to the front end face where the optical density is high, the change of the ridge width is preferably smaller.

Accordingly, in order to obtain a laser device having a small operation current value, a low operation voltage and a high kink level, a ridge portion in the shape as shown in FIG. 3 is preferably employed. Specifically, the ridge portion includes a section with a width reducing from the front end face C toward the rear end face D, and the extent of reducing the width is changed so that the width change is larger on a side close to the rear end face D than on a side close to the front end face C.

This relationship can be expressed by using formulas. Specifically, assuming that a stripe has a width Wf on the front end face C, has a width Wm in a position away from the front end face C toward the rear end face D by a distance Lf, and has a width Wr in a position away from the front end face C toward the rear end face D by a distance Lf+Lb, the following formulas all hold:

$$Wf \geq Wm$$

$$Wm > Wr$$

$$(Wf-Wm)/(2Lf) < (Wm-Wr)/(2Lb)$$

In these formulas, "(Wf−Wm)/(2Lf)" corresponds to the extent of the change of the ridge width in a region close to the front end face C, and "(Wm−Wr)/(2Lb)" corresponds to the extent of the change of the ridge width in a region close to the rear end face D. In a region close to the front end face C, the ridge width may be constant.

However, in the case where the device is separated through cleavage, in order to suppress variation in the ridge width due to a shift of the cleavage position, the ridge width may be constant in the vicinity of the end face over a length of approximately 10 μm or more. In the present embodiment shown in FIG. 2, the rear straight section R where the ridge width is constant is provided in the vicinity of the rear end face D up to a position 20 μm away from the rear end face D toward the front end face C.

Furthermore, assuming that the infrared laser B has a ridge width $W_{f1}$ on the front end face and the red laser A has a ridge width $W_{f2}$ on the front end face, when $W_{f1} \geq W_{f2}$, a semiconductor laser device 1 with a high kink level, a low operation current and capable of driving at a low voltage can be obtained owing to a difference in the temperature characteristic between the infrared laser B and the red laser A.

Specifically, in the semiconductor laser device 1 of this embodiment, the ridge width $W_{f1}$ on the front end face of the infrared laser B is 3.8 μm, which is larger by 0.3 μm than the ridge width $W_{f2}$ on the front end face of the red laser A of 3.5 μm. Thus, increase of the operation voltage in a high-output operation is suppressed.

Moreover, assuming that the infrared laser B has a ridge width $W_1$ and a ridge width $W_2$ respectively in positions away from the front end face C by a distance $L_1$ and by a distance $L_1+L_2$, the aforementioned three relationships are represented as follows:

$$W_{f1} \geq W_1$$

$$W_1 > W_2$$

$$(W_{f1}-W_1)/2L_1 < (W_1-W_2)/2L_2$$

Similarly, assuming that the red laser A has a ridge width $W_3$ and a ridge width $W_4$ respectively in positions away from the front end face C by a distance $L_3$ and by a distance $L_3+L_4$, the aforementioned there relationships are represented as follows:

$$W_{f2} \geq W_3$$

$$W_3 > W_4$$

$$(W_{f2}-W_3)/2L_3 < (W_3-W_4)/2L_4$$

Now, description will be further made by exemplifying specific dimensions.

It is assumed in the red laser A that the width $W_{f2}$ is 3.5 μm, the width $W_3$ is 3.5 μm and the width $W_4$ is 2.1 μm. Also, it is assumed in the infrared laser B that the width $W_{f1}$ is 3.8 μm, the width $W_1$ is 3.8 μm and the width $W_2$ is 2.1 μm. On this assumption, various measurements are performed while changing the length of the linear section portion having a constant ridge width, namely, changing the distance $L_1$ or $L_3$ from the front end face C, from 0 μm to 1000 μm, and the results will now be described.

Figure 5A:
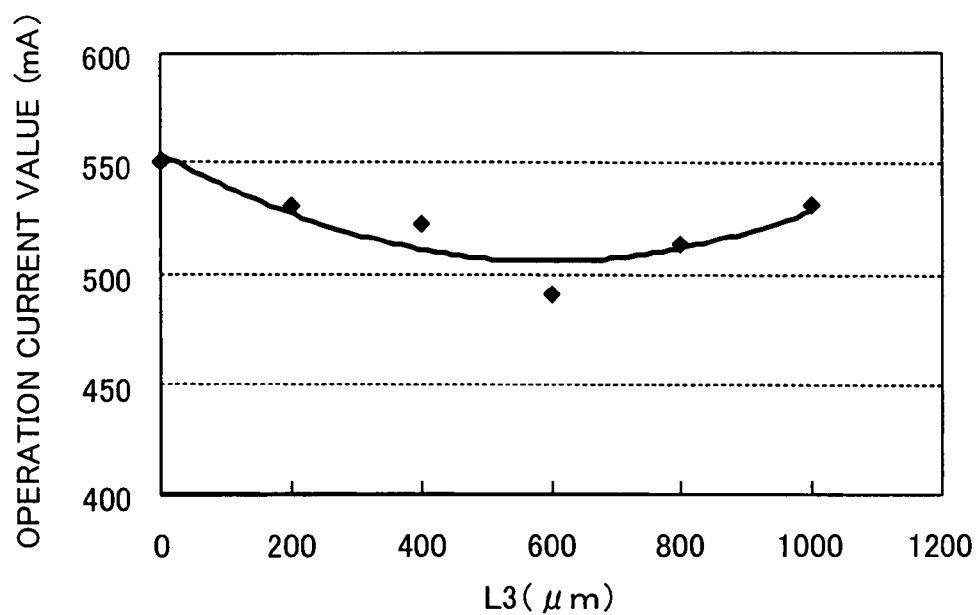
FIGS. 5A and 5B are diagrams for showing dependency of operation current values on distances $L_3$ and $L_1$ in a red laser and an infrared laser, respectively.
Figure 5B:
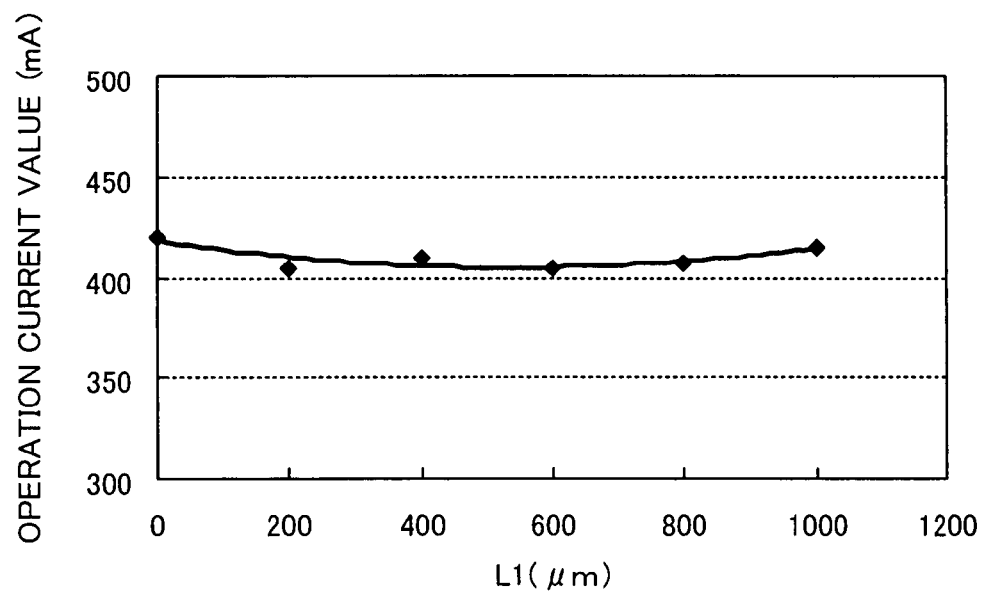
Figure 6A:
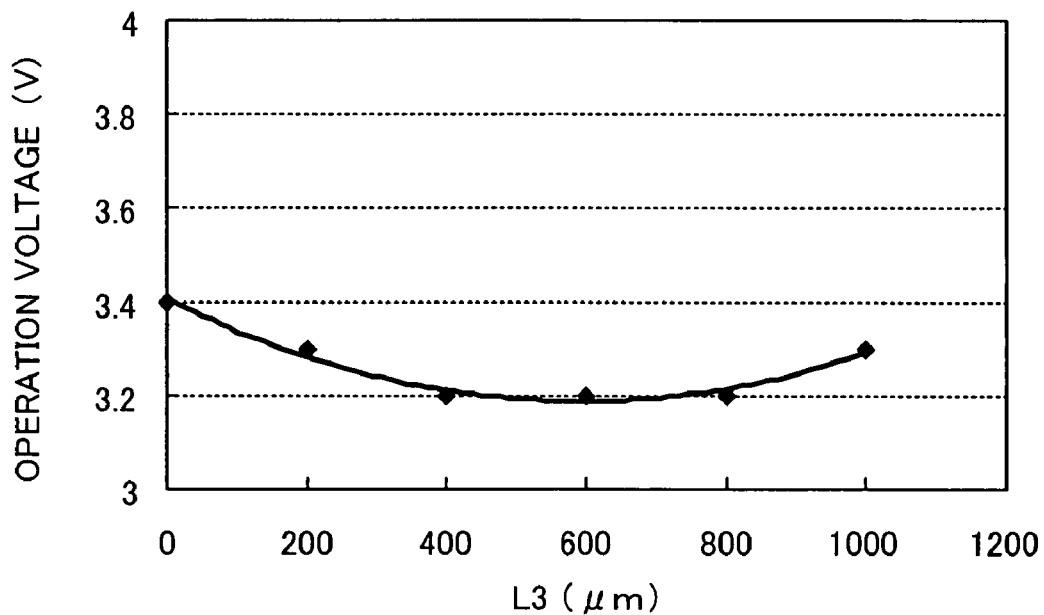
FIGS. 6A and 6B are diagrams for showing dependency of operation voltages on the distances $L_3$ and $L_1$ in the red laser and the infrared laser, respectively.
Figure 6B:
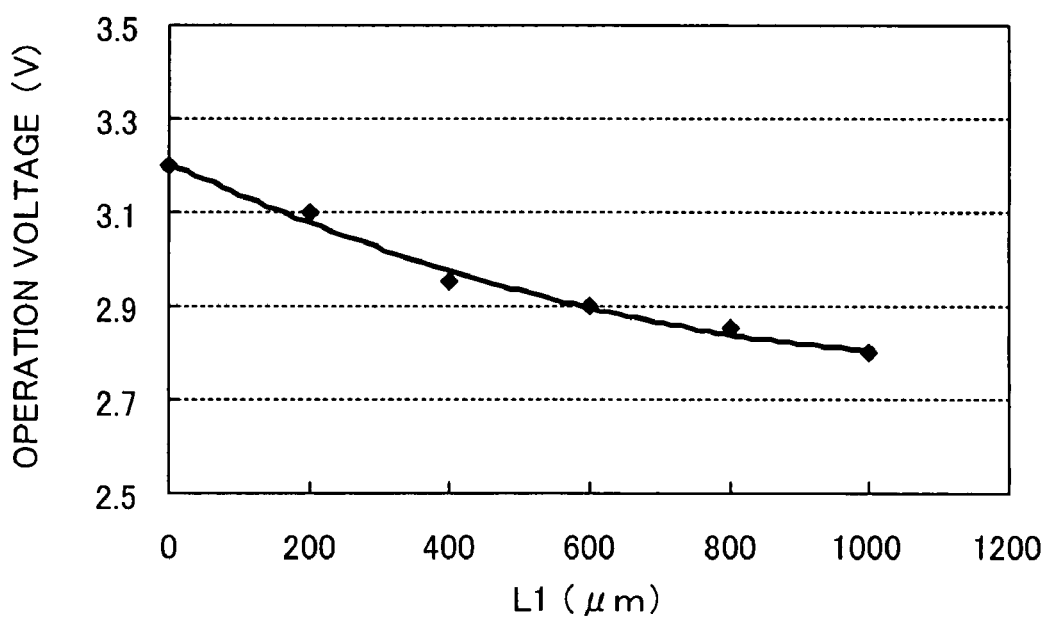
Figure 7A:
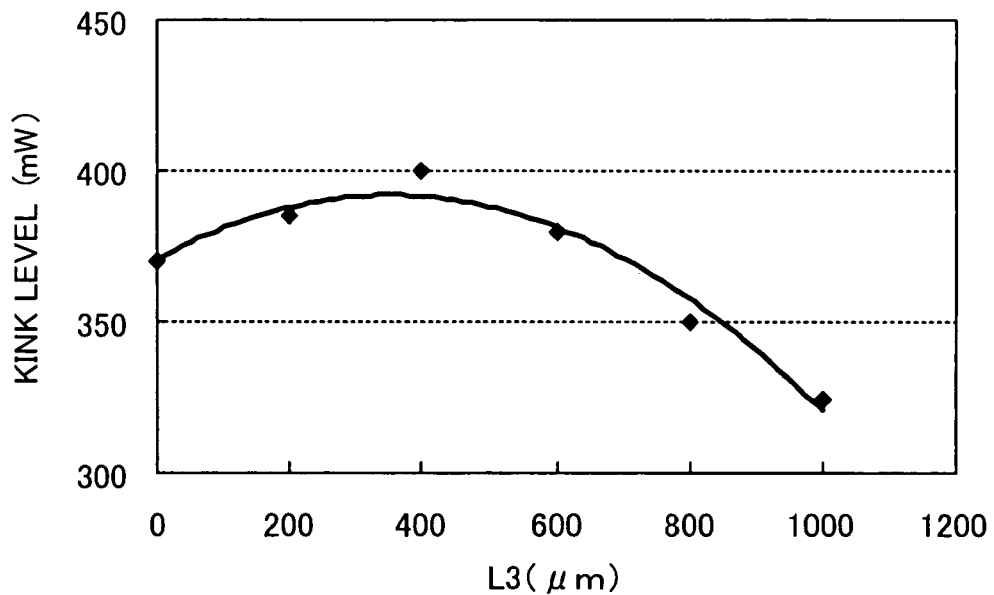
FIGS. 7A and 7B are diagrams for showing dependency of kink levels on the distances $L_3$ and $L_1$ in the red laser and the infrared laser, respectively.
Figure 7B:
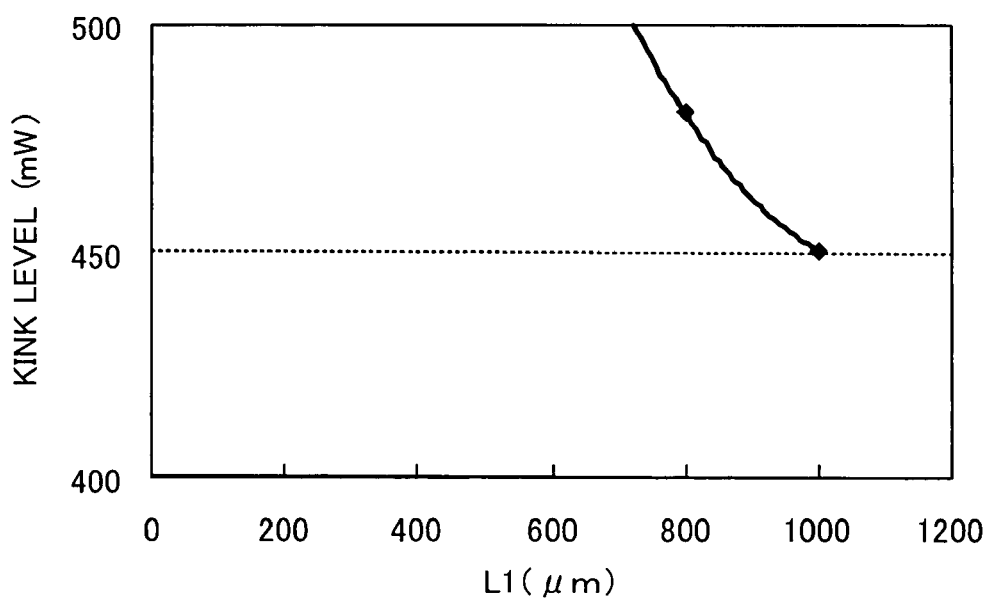

Specifically, with respect to the red laser A and the infrared laser B, the operation current values are respectively shown in FIGS. 5A and 5B, the operation voltages are respectively shown in FIGS. 6A and 6B, and the kink levels are respectively shown in FIGS. 7A and 7B. All the measurements are performed at a temperature of 80° C. for 50 ns at a pulse duty ratio of 40%.

First, the results obtained in the red laser A will be described. As shown in FIGS. 5A and 6A, when the distance $L_3$ that is the length of the linear section with a constant width of the ridge portion 14a on the side of the front end face C is increased, the operation voltage is lowered and the operation current value is also reduced in a range up to the distance $L_3$ of 600 μm. When the distance $L_3$ exceeds 600 μm, however, the operation current value and the operation voltage are both increased. This seems to be because the change in the ridge width becomes large in a region, closer to the rear end face, from the position corresponding to the distance $L_3$ to the position corresponding to the distance $L_3+L_4$ when the distance $L_3$ is too large, and hence, the waveguide loss becomes large.

In this manner, in the red laser A, the section with the constant width of the ridge portion 14a on the side of the front end face is required to have a length of 600 μm or less. Specifically, since the length of the resonator is 1750 μm in this embodiment, the length of this section is set to be 34% or less of the length of the resonator.

Furthermore, as shown in FIG. 7A, when the distance $L_3$ is increased, the kink level is improved in a range up to the distance $L_3$ of 600 μm. However, when the distance $L_3$ exceeds 600 μm, the kink level is lowered. This seems to be because the operation carrier density is lowered due to the lowering of the operation voltage and the operation current value in accordance with the increase of the distance $L_3$ when the distance $L_3$ is as short as 600 μm or less, so that the spatial hole burning in the carrier distribution can be reduced. When the distance $L_3$ is further increased, the kink level is lowered in accordance with the increase of the operation current value.

Accordingly, in the red laser A of this embodiment, the distance $L_3$ is set to 600 μm where the kink level is the highest and the operation voltage and the operation current value are small.

Next, the results obtained in the infrared laser B will be described. As the distance $L_1$ that is the length of the section having a constant width of the ridge portion 24a on the side of the front end face C is increased, the operation voltage is reduced as shown in FIG. 6B. The operation current value is minimally varied and substantially constant having the minimum value correspondingly to the distance $L_1$ of approximately 600 μm. This is because a leakage current is smaller in the infrared laser B than in the red laser A and hence the temperature characteristic is better. Specifically, even when the operation voltage is increased, the overflow of carriers from the active layer derived from the increase of the heat generation of the device due to the increase of the operation voltage is minimally caused.

As shown in FIG. 7B, the kink level of the infrared laser B is 500 mW or more in a range up to the distance $L_1$ of approximately 800 μm. When the distance $L_1$ is further increased, the kink level is lowered and becomes approximately 450 mW when the distance $L_1$ is approximately 800 μm.

In this manner, the kink level is higher in the infrared laser B than in the red laser A. This seems to be because the infrared laser B has a better temperature characteristic than the red laser A and has a lower operation carrier density, so that the special hole burning in the carrier distribution can be smaller.

Accordingly, in the infrared laser B of this embodiment, the distance $L_1$ is set to 800 μm where the kink level of 500 mW or more is attained and a low operation voltage characteristic is attained. Specifically, in the infrared laser B, the distance $L_1$ is preferably set to be 46% or less of the whole length of the resonator (i.e., 1750 µm). When the distances $L_1$ and $L_3$ are thus set to preferable values, a relationship of $L_1 > L_3$ is obtained.

Figure 8A:
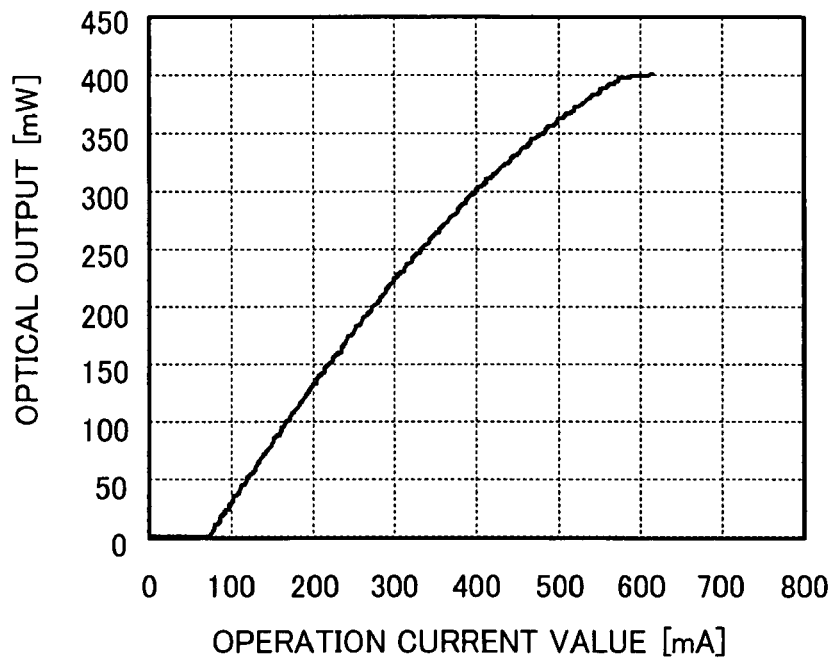
FIGS. 8A and 8B are diagrams for showing current-optical output characteristics of the red laser and the infrared laser, respectively.
Figure 8B:
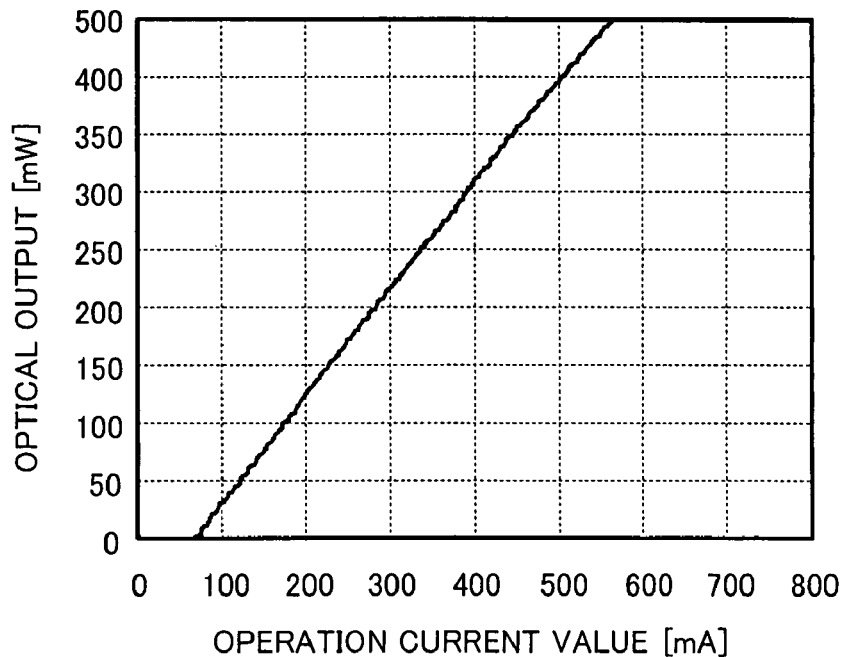

FIGS. 8A and 8B show the current-optical output characteristics of the red laser A and the infrared laser B, respectively. These characteristics are also obtained through measurements performed at a temperature of 80° C. for 50 ns at a pulse duty ratio of 40%.

In the red laser A, no kink is caused up to the optical output of 400 mW. In the infrared laser B, the linearity of the current-optical output characteristic is extremely good and the kink level is 500 mW or more.

Furthermore, in a high-output laser, end faces are coated with dielectric films so that the front end face can attain low reflectance and the rear end face can attain high reflectance, and thus, the luminous efficiency is improved and a high COD level is realized. For this purpose, the optical field distribution intensity along the resonator direction is longitudinally asymmetric within the resonator and the intensity is higher on a side of the front end face than on a side of the rear end face. As a result, stronger stimulated emission is caused in a front end face portion with a higher optical density than in a rear end face portion. In order to obtain more stimulated emission light, a larger number of electron-hole pairs should be present in the active layer. Accordingly, a larger number of electron-hole pairs are necessary in the front end face portion of the active layer than in the rear end face portion thereof.

In the case where the ridge width is constant along the resonator direction, the current is uniformly injected along the resonator direction. As a result, in a part of the active layer corresponding to the front end face coated for attaining low reflectance in a high-output state, supply of electron-hole pairs becomes insufficient when the optical output exceeds a given value, resulting in saturating gain.

In general, assuming that the front end face and the rear end face respectively have reflectance Rf and Rr and the resonator has a length L, a point having the minimum optical density along the resonator direction is a point away from the front end face by a distance of L×ln(Rf)/ln(Rf×Rr). Therefore, the width of the ridge portion is changed along the resonator direction in accordance with this optical distribution intensity, so that the ridge width can be reduced in accordance with the reduction of the optical density. Specifically, a difference between a distance from the front end face of a point having the minimum ridge width and the distance from the front end face of L×ln(Rf)/ln(Rf×Rr) is set to 200 µm or less.

When the ridge width is changed along the resonator direction so that the ridge width can be larger in a region where a larger number of electron-hole pairs are necessary for allowing a larger current to be easily injected, a laser in which gain saturation is minimally caused even in a high-output operation and which has a good temperature characteristic and high efficiency can be obtained. In particular, when a difference between a distance from the front end face to the point with the minimum ridge width and the distance from the front end face of L×ln(Rf)/ln(Rf×Rr) is 200 µm or less, the use current efficiency can be further increased.

Next, a method for fabricating a semiconductor laser device similar to the semiconductor laser device 1 of this embodiment will be described with reference to the accompanying drawings. FIGS. 9A through 9C, 10A through 10C and 11A through 11C are cross-sectional views for explaining the fabrication method for the semiconductor laser device.

First, as shown in FIG. 9A, an n-type buffer layer 11 (with a thickness of 0.5 µm) made of n-type GaAs, an n-type cladding layer 12 (with a thickness of 2.0 µm) made of n-type $(Al_{0.7}Ga_{0.3})_{0.51}In_{0.49}P$, an active layer 13 having a strained quantum well structure, a p-type cladding layer 14 made of p-type $(Al_{0.7}Ga_{0.3})_{0.51}In_{0.49}P$, an intermediate layer 16 (with a thickness of 50 nm) made of p-type $Ga_{0.51}In_{0.49}P$, a p-type contact layer 17 (with a thickness of 0.4 µm) made of p-type GaAs, and p-type boundary layer 18 (with a thickness of 0.05 nm) made of $Ga_{0.51}In_{0.49}P$ are successively stacked in this order in the upward direction on an n-type GaAs substrate 10. For stacking these layers, for example, MOCVD (metal organic chemical vapor deposition) or MBE (molecular beam epitaxy) is employed for crystal growth. Furthermore, the n-type GaAs substrate 10 herein has a plane inclined from the (100) plane by 10 degrees in the [011] direction as the principal plane.

More specifically, the active layer 13 has a multilayered structure as shown in FIG. 1B. In this structure, a second guide layer 13g2, a well layer 13w3, a barrier layer 13b2, a well layer 13w2, a barrier layer 13b1, a well layer 13w1 and a first guide layer 13g1 are successively formed in the upward direction. Although the active layer has the strained quantum well structure in this embodiment, a quantum well layer with no strain may be used or a bulk active layer may be used. Also, the conductivity type of the active layer may be either p-type or n-type, or it may be an undoped layer.

Next, a resist pattern 19 is formed on the p-type boundary layer 18 by photolithography, and then a multilayered body obtained as shown in FIG. 9A is etched by using the resist pattern 19 as a mask. Thus, the layers from the n-type buffer layer 11 to the p-type boundary layer 18 stacked in the previous procedure are removed in a region not covered with the resist pattern 19 as shown in FIG. 9B. An etchant used in this etching may be a sulfate-based etchant or a chloride-based etchant.

Then, after removing the resist pattern 19, an n-type buffer layer 21 (with a thickness of 0.5 µm) made of n-type GaAs, an n-type cladding layer 22 (with a thickness of 2.0 µm) made of n-type $(Al_{0.7}Ga_{0.3})_{0.51}In_{0.49}P$, an active layer 23 having a quantum well structure, a p-type cladding layer 24 made of p-type $(Al_{0.7}Ga_{0.3})_{0.51}In_{0.49}P$, an intermediate layer 26 (with a thickness of 50 nm) made of p-type $Ga_{0.51}In_{0.49}P$, and a p-type contact layer 27 (with a thickness of 0.4 µm) made of p-type GaAs are stacked also by the MOCVD or the MBE as shown in FIG. 9C.

The active layer 23 has a multilayered structure as shown in FIG. 1C. Specifically, a second guide layer 23g2, a well layer 23w3, a barrier layer 23b2, a well layer 23w2, a barrier layer 23b1, a well layer 23w1 and a first guide layer 23g1 are successively formed in the upward direction.

Figure 10A:
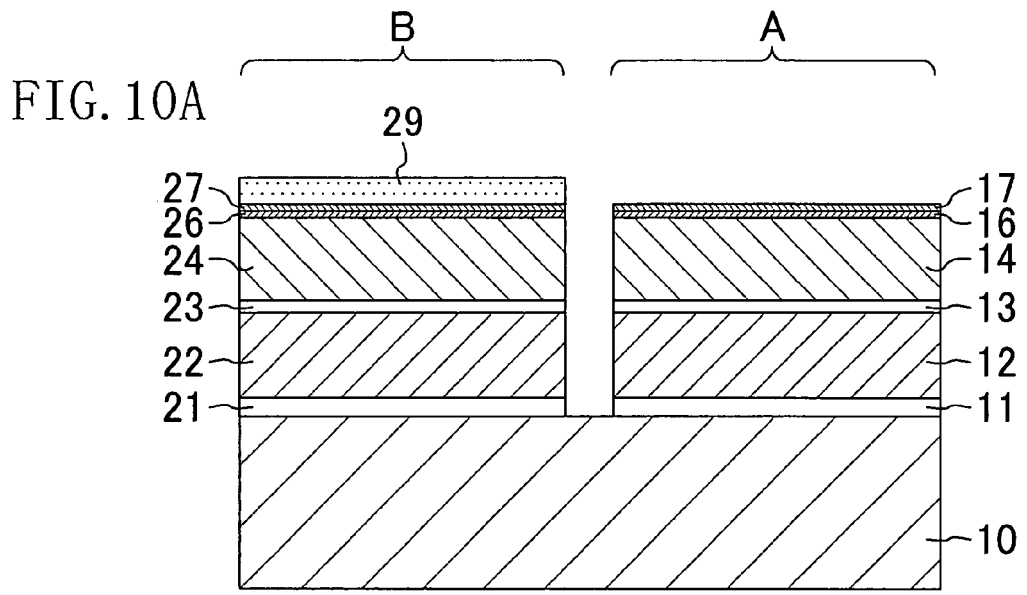
FIGS. 10A, 10B and 10C are diagrams for showing other procedures in the fabrication of the semiconductor laser device 1.

Next, as shown in FIG. 10A, a resist pattern 29 is formed by the photolithography, and the stacked layers from the n-type buffer layer 21 to the p-type contact layer 27 are removed by the etching using the resist pattern 29 as a mask in a region not covered with the resist pattern 29. Thereafter, the resist pattern 29 is removed.

Figure 10B:
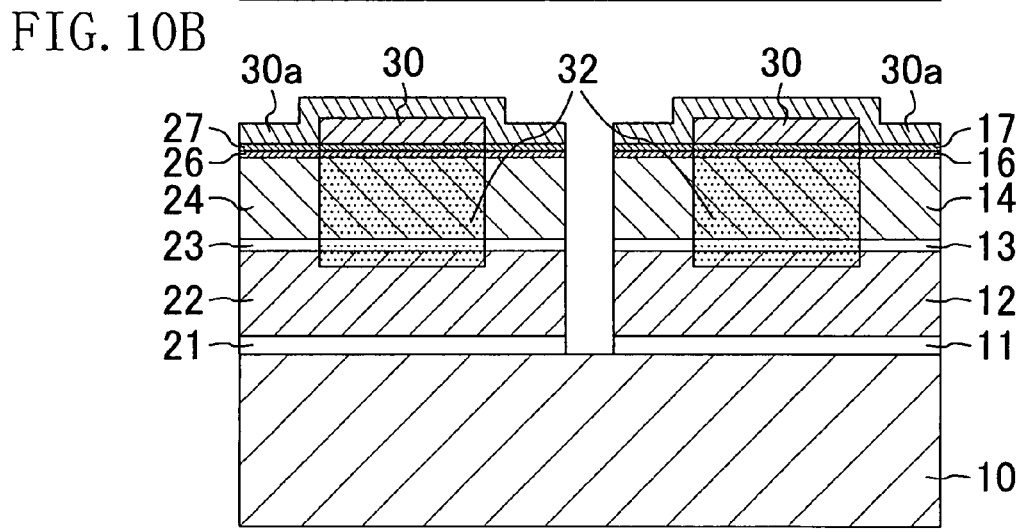

Then, as shown in FIG. 10B, a Zn film with a thickness of 0.3 µm is deposited on the p-type contact layers 17 and 27 by thermal CVD (performed at 370° C.) or the like, and the Zn film is patterned into a Zn diffusion source 30 by the photolithography and the etching. Furthermore, a $SiO_2$ film 30a with a thickness of 0.3 µm is deposited so as to cover the Zn diffusion source 30 and the p-type contact layers 17 and 27.

Thereafter, Zn is thermally diffused from the Zn diffusion source 30, so as to form a Zn diffused region 32. At this point, since the whole surface is covered with the $SiO_2$ film 30a, crystallinity degradation in surface portions of the p-type contact layers 17 and 27 and thermal decomposition of the Zn diffusion source 30 can be suppressed during the Zn diffusion. As a result, a window region can be stably formed without degrading the crystallinity of a waveguide in the window region.

After the diffusion, the Zn diffusion source 30 and the SiO$_2$ layer 30a are removed. The Zn diffused region 32 corresponds to regions working as window regions in the active layers 13 and 23. The Zn diffusion source 30 is disposed correspondingly to the window regions. A window region is formed, for example, on the front end face of a resonator.

Figure 10C:
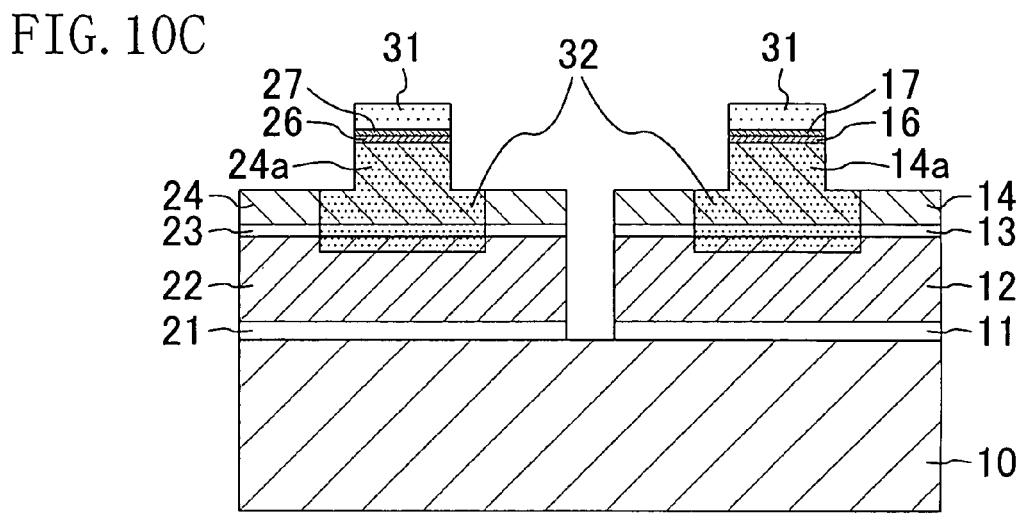

Next, as shown in FIG. 10C, after depositing a silicon oxide film with a thickness of 0.3 μm on the p-type contact layers 17 and 27 by the thermal CVD (performed at 370° C.), the silicon oxide film is patterned into a stripe mask 31 by the photolithography and the etching.

Subsequently, the p-type contact layers 17 and 27, the p-type intermediate layers 16 and 26 and the p-type cladding layers 14 and 24 are successively selectively etched by using the stripe mask 31 as a mask, so as to form mesa-shaped ridge portions 14a and 24a in the multilayered bodies having a hetero structure. At this point, the p-type cladding layers 14 and 24 are allowed to remain as thinner films than those formed before this etching also in regions excluding the ridge portions 14a and 24a. Thereafter, the stripe mask 31 is selectively removed in regions corresponding to the window regions with the other part of the stripe mask 31 allowed to remain.

Figure 11A:
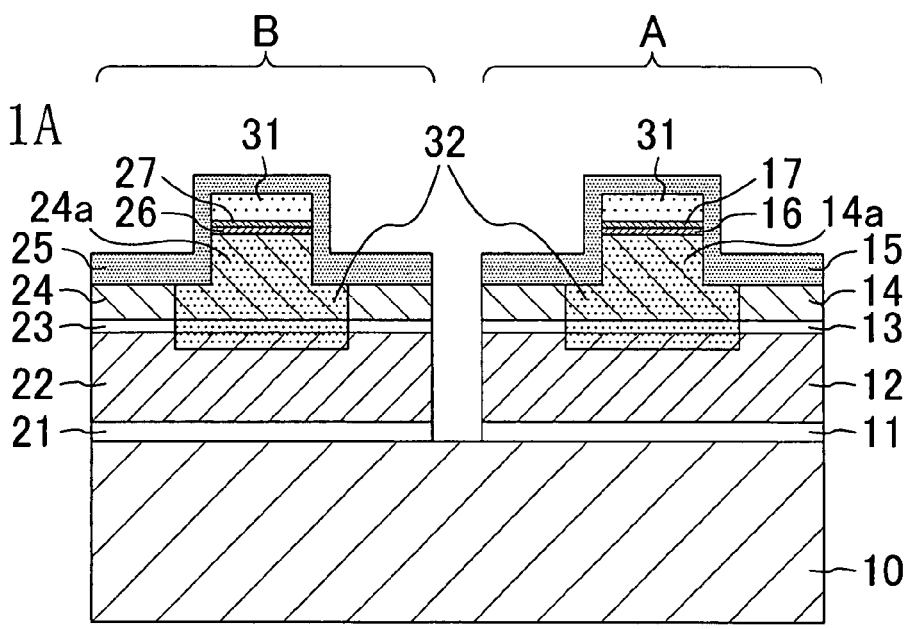
FIGS. 11A, 11B and 11C are diagrams for showing other procedures in the fabrication of the semiconductor laser device 1.

Next, a current blocking layers 15 and 25 made of n-type AlInP are formed by the MOCVD or the MBE. At this point, in the regions corresponding to the window regions, the current blocking layers 15 and 25 are formed so as to cover the sidewalls of the ridge portions 14a and 24a and the remaining parts of the p-type cladding layers 14 and 24 as shown in FIG. 11A. As a result, a part of the ridge portion corresponding to the window region is covered with the current blocking layer, and hence, current injection into the window region from above the ridge portion can be prevented. When a current is injected into the window region, heat generation through non-radiative recombination making no contribution to the laser oscillation is increased, so as to lower the COD level. Therefore, the current injection into the window region is thus prevented.

Figure 11B:
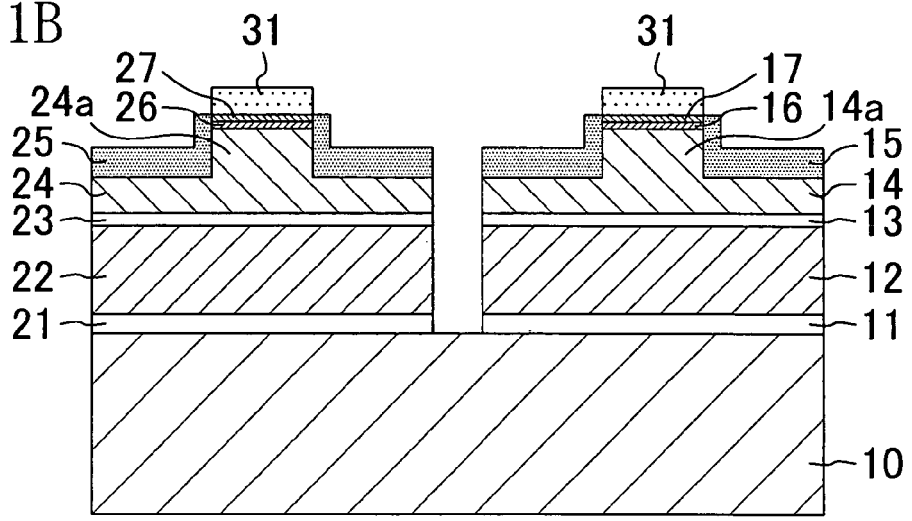

Furthermore, in the regions not corresponding to the window regions, the p-type current blocking layers 15 and 25 made of n-type AlInP are grown selectively on the sidewalls of the ridge portions 14a and 24a and on the p-type cladding layers 14 and 24 alone as shown in FIG. 11B. This is because the stripe mask 31 made of silicon oxide and formed on the top faces of the ridge portions 14a and 24a suppresses the crystal growth thereon.

Figure 11C:
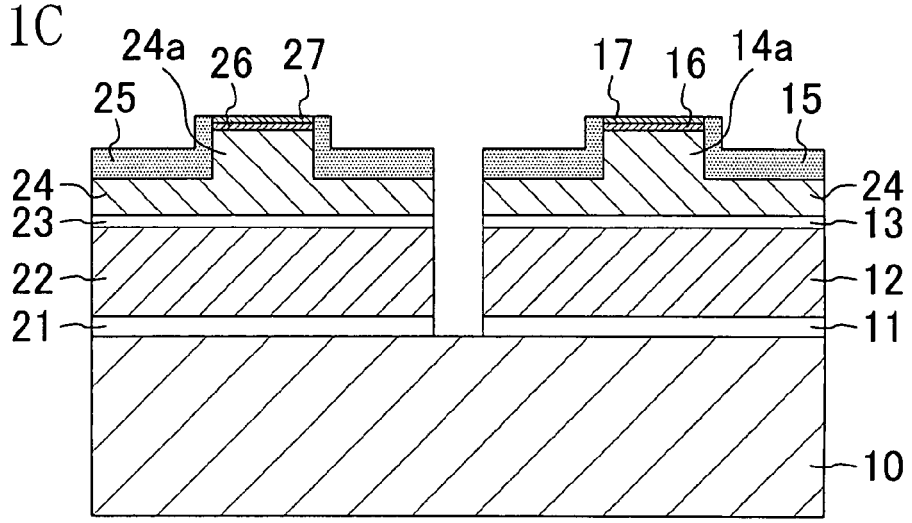
Figure 12:
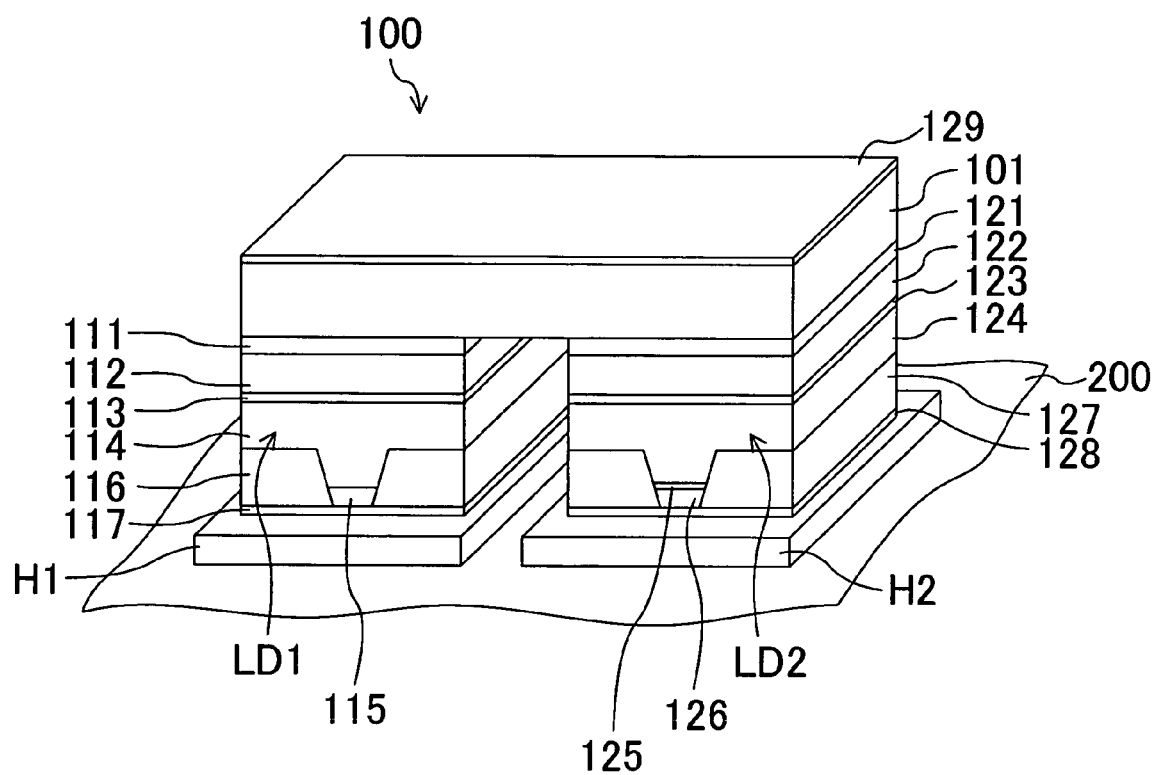
FIG. 12 is a diagram of an example of a conventional semiconductor laser device.

Thereafter, as shown in FIG. 11C, the stripe mask 31 is removed through etching using a hydrofluoric acid-based etchant. At this point, an opening is formed in the current blocking layer on the top face of the ridge portion, and hence, a current can be injected through the top face of the ridge portion.

In the case where the n-type current blocking layers 15 and 25 are made of a dielectric layer, the stripe mask 31 is removed after forming the ridge portions 14a and 24a as shown in FIG. 10C without forming the current blocking layers 15 and 25. Thereafter, a dielectric layer is formed over the whole top surface, and a resist is patterned so as to have openings on the p-type contact layers 17 and 27 disposed above the parts of the ridge portions 14a and 24a not corresponding to the window regions. Furthermore, the dielectric layer is etched with a hydrofluoric acid-based etchant by using the resist as a mask so as to remove parts thereof disposed above the p-type contact layers 17 and 27. Thus, the dielectric layer is formed on a part of the upper end of the ridge portion corresponding to the window region with no dielectric layer formed on a part of the upper end of the ridge portion not corresponding to the window region. As a result, no current is injected into the window region through the upper end of the ridge portion, and the window region is formed as a region into which no current is injected.

Also, parts of the p-type GaAs contact layers 27 and 17 corresponding to the window regions may be selectively removed by using the stripe pattern 31 as a mask before forming the current blocking layers 25 and 15. In this case, since the parts of the p-type GaAs contact layers 27 and 17 corresponding to the window regions having crystallinity degraded in surface portions through the Zn diffusion are removed, occurrence of an interfacial leakage current passing on an interface between the current blocking layer above the ridge portion corresponding to the window region and the p-type GaAs contact layer can be suppressed, and therefore, the COD level can be more stably prevented from lowering.

It is noted that the dielectric film preferably includes at least one of SiN, SiO$_2$, TiO$_2$, Al$_2$O$_3$ and hydrogenated amorphous Si for attaining a difference in the refractive index from the cladding layer. Alternatively, the dielectric film may be a multilayered body including any of these materials.

In this manner, the semiconductor laser device of this embodiment is fabricated. However, the materials, the shapes, the dimensions and the like mentioned above are merely examples and do not limit the invention.

Furthermore, the same thermal history is employed in forming the window regions in the red laser A and the infrared laser B. Therefore, the amount of Zn diffused in the part of the cladding layer corresponding to the window region can be the same in the red laser A and the infrared laser B, so that reproducibility of a difference in the refractive index from a gain portion can be high. Therefore, optimum values can be set so as not to disturb FFP waveforms with respect to the set length of the window region.

Although the crystals are grown in the red laser portion after growing the crystals in the infrared laser portion in this embodiment, the crystals may be grown in the infrared laser portion after growing the crystals in the red laser portion.

What is claimed is:

1. A semiconductor laser device comprising:

a first light emitting portion and a second light emitting portion provided on a substrate and having the same resonator length L, wherein each of said first light emitting portion and said second light emitting portion includes a first cladding layer of a first conductivity type, an active layer provided on said first cladding layer and a second cladding layer of a second conductivity type provided on said active layer, and has a stripe structure for injecting carriers, said stripe structure of said first light emitting portion has a section having a width changing along a resonator direction and includes a first front end face, the following relationships hold:

$W_{f1} \geq W_1$;

$W_1 > W_2$; and $(W_{f1} - W_1)/2L_1 < (W_1 - W_2)/2L_2$ wherein $W_{f1}$ is a width of said stripe structure on said first front end face; $W_1$ is a width of said stripe structure in a position away from said first front end face by a distance $L_1$; and $W_2$ is a width of said stripe structure in a position away from said first front end face by a distance $L_1+L_2$ (whereas $L_1+L_2 \leq L$), said stripe structure of said second light emitting portion has a section having a width changing along a resonator direction and includes a second front end face, and the following relationships hold:

$W_{f2} \geq W_3$;

$W_3 > W_4$; and $(W_{f2}-W_3)/2L_3 < (W_3-W_4)/2L_4$, wherein $W_{f2}$ is a width of said stripe structure on said second front end face; $W_3$ is a width of said stripe structure in a position away from said second front end face by a distance $L_3$ (whereas $L_1 \neq L_3$); and $W_4$ is a width of said stripe structure in a position away from said second front end face by a distance $L_3+L_4$ (whereas $L_3+L_4 \leq L$).

2. The semiconductor laser device of claim 1, wherein an oscillation wavelength of said first light emitting portion is longer than an oscillation wavelength of said second light emitting portion, and there is a relationship of $L_1 > L_3$.

3. The semiconductor laser device of claim 1, wherein there is a relationship of Rf<Rr between reflectance Rf on each of said first front end face and said second front end face and reflectance Rr on a rear end face of said stripe structure of each of said first and second light emitting portions.

4. The semiconductor laser device of claim 1, wherein each of said first cladding layer and said second cladding layer is made of an AlGaInP-based material.

5. The semiconductor laser device of claim 1, wherein said active layer of said first light emitting portion is made of a GaAs-based, AlGaAs-based or InGaAsP-based material, and said active layer of said second light emitting portion is made of an InGaP-based or AlGaInP-based material.

6. The semiconductor laser device of claim 5, wherein said active layer of at least one of said first light emitting portion and said second light emitting portion is a quantum well active layer.

7. The semiconductor laser device of claim 6, wherein a part of said active layer is disordered by introducing an impurity into at least one end face of said stripe structure of each of said first light emitting portion and said second light emitting portion.

8. The semiconductor laser device of claim 7, wherein said stripe structure of each of said first light emitting portion and said second light emitting portion includes a mesa-shaped ridge portion, and layers made of the same material are formed on sidewalls of said mesa-shaped ridge portions in said first light emitting portion and said second light emitting portion.

9. The semiconductor laser device of claim 8, wherein said same material is an AlInP-based material or an AlGaInP-based material.

10. The semiconductor laser device of claim 8, wherein said same material is a dielectric material.

11. The semiconductor laser device of claim 10, wherein said dielectric material includes at least one of amorphous Si, SiN, $SiO_2$, $TiO_2$ and $Al_2O_3$.

12. The semiconductor laser device of claim 1, wherein assuming that a distance from a point with the minimum width of said stripe structure in said first light emitting portion to said first front end face is $L_5$, that a distance from a point with the minimum width of said stripe structure in said second light emitting portion to said second front end face is $L_6$, and that said first front end face and said second front end face have reflectance Rf and a rear end face of said stripe structure has reflectance Rr, there is a relationship of Rf<Rr, and each of said distances $L_5$ and $L_6$ is different from a distance represented as $L \times \ln(Rf)/\ln(Rf \times Rr)$ by 200 μm or less (wherein ln is natural logarithm).

13. The semiconductor laser device of claim 1, wherein an oscillation wavelength of said first light emitting portion is longer than an oscillation wavelength of said second light emitting portion, and there is a relationship of $W_{f1} > W_{f2}$.

14. The semiconductor laser device of claim 1, wherein said active layer has a window region that is disordered by introducing an impurity, and no current is injected into said window region.

* * * * *